(12) United States Patent
Feldman et al.

(10) Patent No.: US 7,827,378 B2
(45) Date of Patent: Nov. 2, 2010

(54) DEFECT MANAGEMENT USING MUTABLE LOGICAL TO PHYSICAL ASSOCIATION

(75) Inventors: Timothy R. Feldman, Louisville, CO (US); Jonathan W. Haines, Boulder, CO (US); Craig W. Miller, Loveland, CO (US); Edwin S. Olds, Fort Collins, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 480 days.

(21) Appl. No.: 11/842,653

(22) Filed: Aug. 21, 2007

(65) Prior Publication Data

US 2009/0055620 A1 Feb. 26, 2009

(51) Int. Cl.
*G06F 13/00* (2006.01)

(52) U.S. Cl. ............... 711/202; 711/156; 365/200

(58) Field of Classification Search ............... 711/202, 711/156; 365/200
See application file for complete search history.

(56) References Cited

U.S. PATENT DOCUMENTS

| | | | |
|---|---|---|---|
| 5,313,585 A | 5/1994 | Jeffries et al. | 395/275 |
| 5,313,626 A | 5/1994 | Jones et al. | 395/575 |
| 5,844,911 A | 12/1998 | Schadegg et al. | 371/10.2 |
| 6,728,899 B1 | 4/2004 | Ng et al. | 714/8 |
| 6,738,924 B1 | 5/2004 | Williams et al. | 714/7 |
| 7,032,087 B1 * | 4/2006 | Chang et al. | 711/156 |
| 7,047,438 B2 | 5/2006 | Smith et al. | 714/8 |
| 7,124,337 B2 | 10/2006 | Lambert et al. | 714/723 |
| 7,188,226 B2 | 3/2007 | de Brebisson et al. | 711/170 |
| 2004/0100719 A1* | 5/2004 | Wilson et al. | 360/75 |
| 2005/0086573 A1 | 4/2005 | Lambert et al. | 714/763 |
| 2006/0176947 A1* | 8/2006 | Lim | 375/232 |
| 2007/0174582 A1 | 7/2007 | Feldman | |
| 2008/0316639 A1* | 12/2008 | Tang et al. | 360/77.08 |

* cited by examiner

*Primary Examiner*—Yong Choe
(74) *Attorney, Agent, or Firm*—Westman, Champlin & Kelly, P.A.

(57) ABSTRACT

The application relates to defect management using mutable logical to physical association. Embodiments disclosed utilize mutable mapping between logical blocks and physical blocks. Dynamically updated mapping data, which mutably associates the logical blocks and the physical blocks, also includes physical block defect allocations.

11 Claims, 13 Drawing Sheets

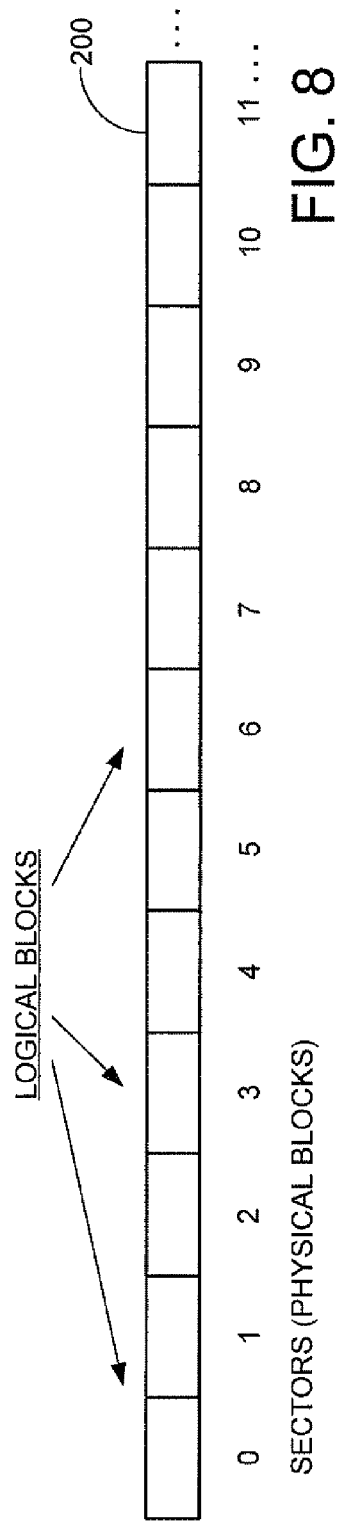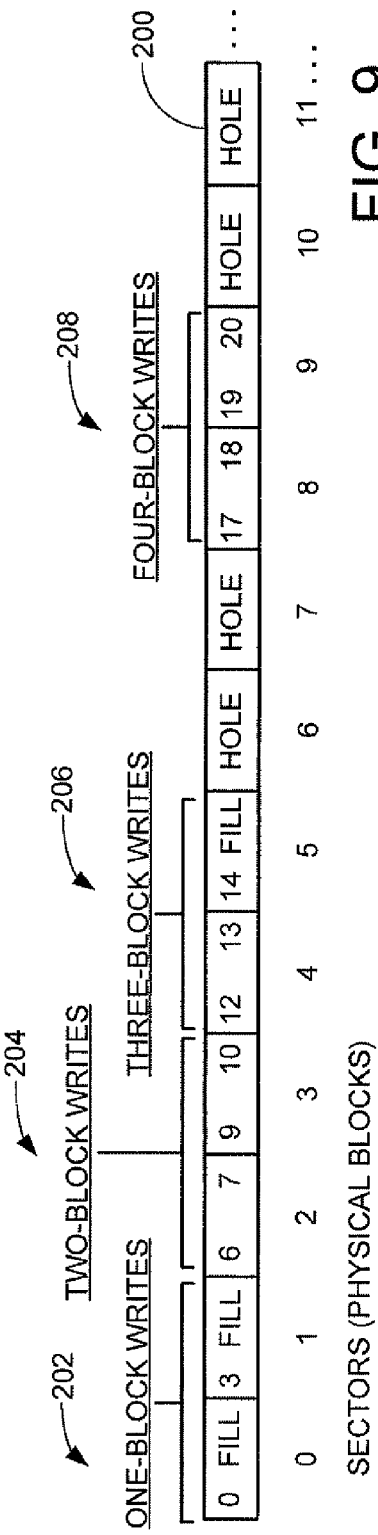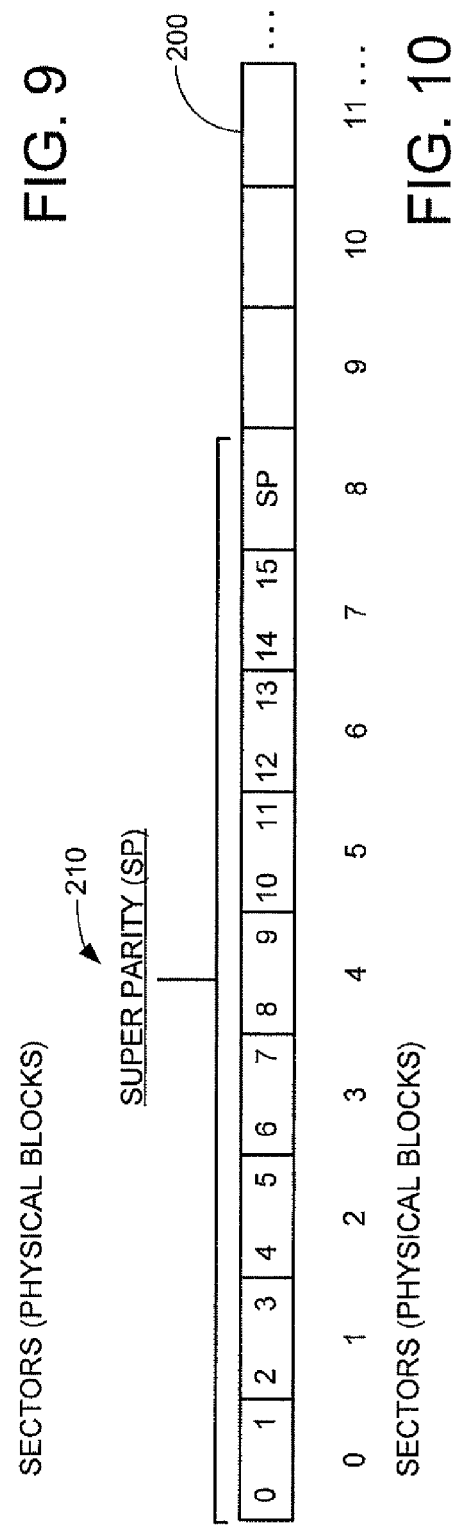

X = USER DATA (ALLOCATED)
H = HOLE (SAFE TO WRITE)
NS = HOLE (NOT SAFE TO WRITE)
SP = SUPER PARITY VALUE
* = HOLE (HOLD FOR SP)

MAP FORMAT (FOR EACH BAND)

MAP FORMAT (FOR EACH BAND)

DEFECT MANAGEMENT USING MUTABLE LOGICAL TO PHYSICAL ASSOCIATION

FIELD

The present embodiments relate generally to the field of data storage systems and more particularly, but not by way of limitation, to methods and apparatus for defect management in block storage devices.

BACKGROUND

Data storage devices are used to access digital data in a fast and efficient manner. At a host level, user data are often structured in terms of variable length files, which can be constituted from one or more fixed sized logical blocks (such as logical block addresses, LBAs).

To store or retrieve user data with an associated data storage device, host commands are generally issued to the device using a logical block convention. The device carries out an internal conversion of the LBAs to locate the associated physical blocks (e.g., sectors) of media on which the data are to be stored, or from which the data are to be retrieved.

When the data storage device is characterized as a disc drive, a controller may be used to execute a seek command to move a data transducer adjacent a rotating magnetic recording disc and carry out the data transfer operation with the associated physical sector(s). Other types of data storage devices (for example, solid state data storage devices that have no moving parts) generally carry out other types of access operations to transfer the associated data.

Data storage device designers have thus often established a substantially one-to-one correspondence between LBAs in the logical space and sectors in the physical space, with consecutively numbered LBAs being largely assigned to consecutively located physical sectors on the media. This can promote improved efficiencies, particularly with large streaming user data files (e.g., audiovisual or other data) that involve large sequential requests for LBAs.

Nevertheless, with continued demands for data storage devices with ever higher data storage and data transfer capabilities for a wide range of data types, there remains a continual need for improvements in the manner in which logical blocks are mapped to physical blocks in respective logical and physical spaces. It is to these and other improvements that the present embodiments are generally directed.

SUMMARY

Embodiments disclosed in the application relate to defect management using mutable logical to physical association. The embodiments utilize mutable mapping between logical blocks and physical blocks. Dynamically updated mapping data, which mutably associates the logical blocks and the physical blocks, also includes physical block defect allocations.

In one method embodiment, a set of logical block addresses (LBAs) from a logical space is assigned to physical block addresses (PBAs) in a physical space. In conjunction with a transfer of data to physical blocks at individual PBAs in the physical space, individual LBAs of the set of LBAs are newly associated with the individual PBAs in the physical space. Upon the detection of a defect in a physical block at an individual PBA in the physical space, the defective physical block is designated as not safe to use.

In another method embodiment, upon detecting a grown defect in a first physical block on a storage medium, the first physical block is mapped out from a logical-to-physical mapping of the storage medium. The logical-to-physical mapping for the storage medium is independent of any reserved spare sectors. Data is stored to the storage medium according to the logical-to-physical mapping of the storage medium.

In still another method embodiment, a storage medium having a plurality of physical blocks is installed in a storage device. Manufacture of the storage device is then completed. At least some of the plurality of physical blocks are certified subsequent to manufacture of the storage device to identify defective physical blocks.

In an apparatus embodiment, a dynamically updated map mutably associates logical blocks to physical blocks. The dynamically updated map also includes physical block defect allocations.

These and various other features and advantages which characterize the claimed embodiments will become apparent upon reading the following detailed description and upon reviewing the associated drawings.

BRIEF DESCRIPTION OF THE DRAWINGS

FIG. 8 shows a generalized mapping from a logical space (logical blocks) to the physical space (physical blocks or sectors) in a selected band.

FIG. 9 represents various preferred writing techniques to the selected band of FIG. 8.

FIG. 10 illustrates utilization of super parity (SP) techniques to the selected band of FIG. 8.

DETAILED DESCRIPTION

Figure 1:
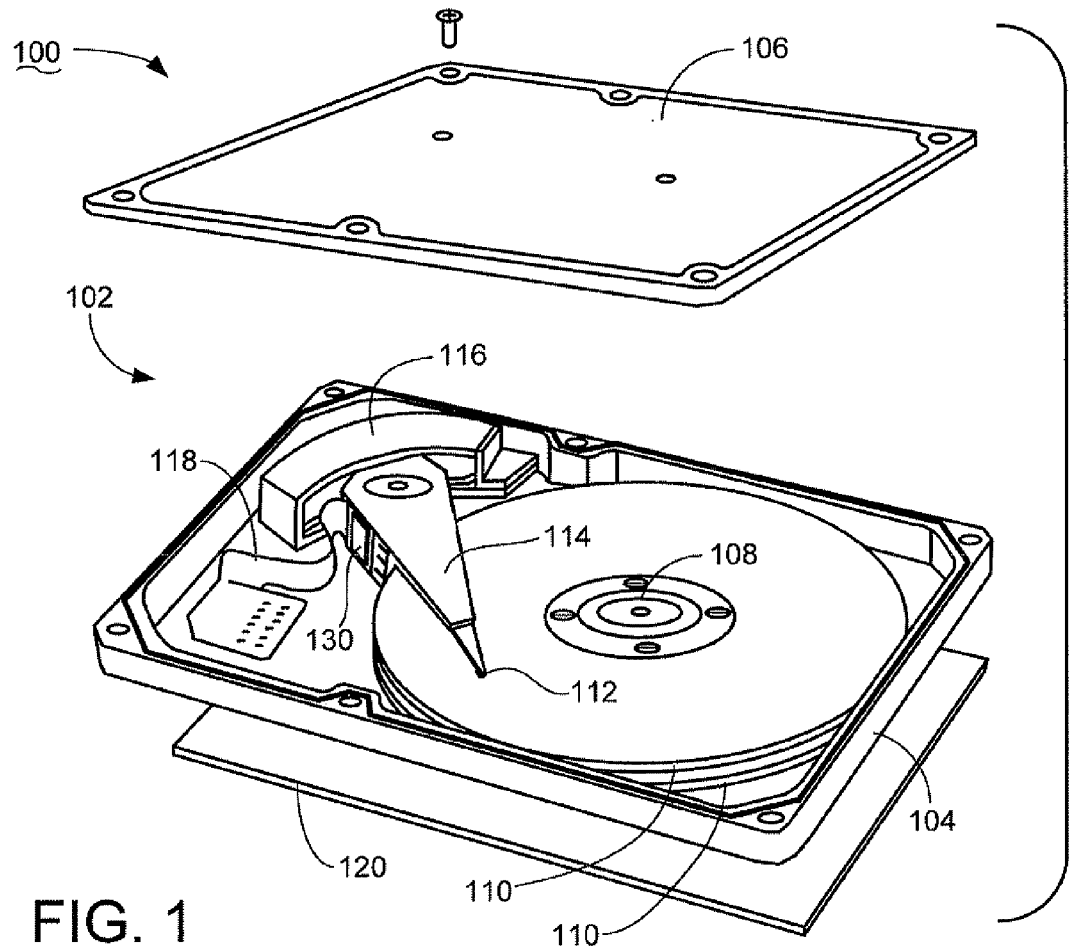
FIG. 1 is an exploded view of a data storage device constructed and operated in accordance with preferred embodiments.

FIG. 1 shows an exploded view of a data storage device 100 to provide an exemplary environment in which preferred embodiments can be advantageously practiced. The device 100 is preferably characterized as a hard disc drive of the type used to store and retrieve digital data in a computer system or network, consumer device, etc.

The device 100 includes a rigid, environmentally controlled housing 102 formed from a base deck 104 and a top cover 106. A spindle motor 108 is mounted within the housing 102 to rotate a number of data storage media 110 at a relatively high speed.

Data are arranged on the media 110 in concentric tracks which are accessed by a corresponding array of data transducing heads 112. The heads 112 (transducers) are supported by an actuator 114 and moved across the media surfaces by application of current to a voice coil motor, VCM 116. A flex circuit assembly 118 facilitates communication between the actuator 114 and control circuitry on an externally mounted printed circuit board, PCB 120.

Figure 2:
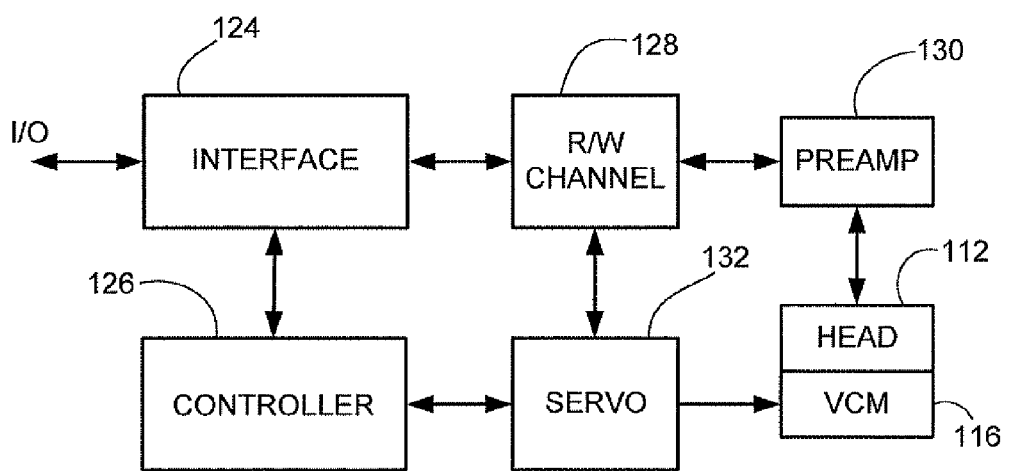
FIG. 2 is a generalized functional block diagram of the device of FIG. 1.

As shown in FIG. 2, the control circuitry preferably includes an interface circuit 124 which communicates with a host device using a suitable interface protocol. A top level processor 126 provides top level control for the device 100 and is preferably characterized as a programmable, general purpose processor with suitable programming to direct the operation of the device 100.

A read/write channel 128 operates in conjunction with a preamplifier/driver circuit (preamp) 130 to write data to and to recover data from the discs 108. The preamp 130 is preferably mounted to the actuator 114 as shown in FIG. 1. A servo circuit 132 provides closed loop positional control for the heads 112.

Figure 3:
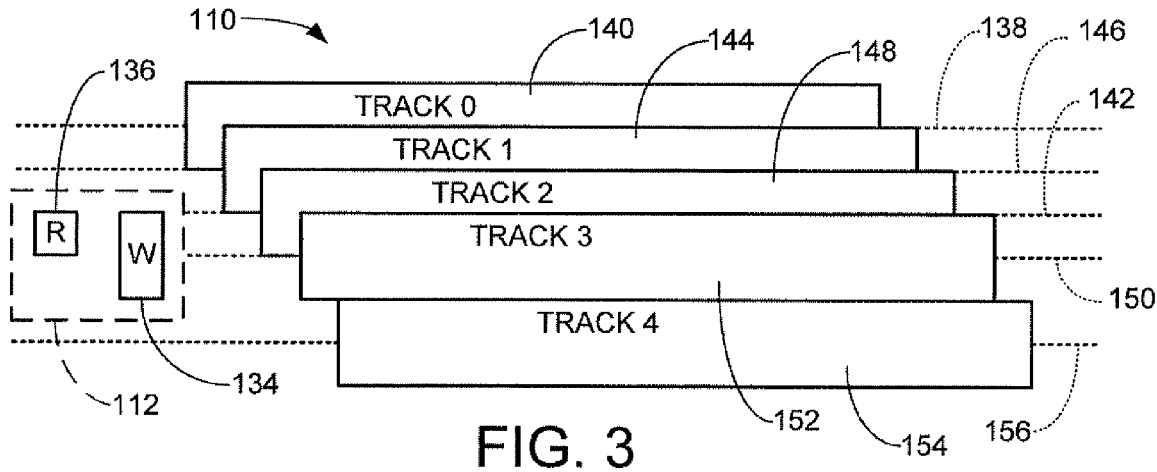
FIG. 3 illustrates an overlapping data write technique that can be advantageously employed by the device of FIG. 1 in conjunction with preferred embodiments.

Each transducer 112 preferably has separate write (W) and read (R) elements 134, 136 as shown in FIG. 3. The write element 134 preferably comprises an inductive vertical or horizontal writer. The read elements 136 can have any number of desired constructions including magneto-resistive (MR), spin-valve (SV), tunneling giant MR (TGMR), etc.

The use of separate write and read elements 134, 136 facilitates implementation of an overlapping track arrangement which, although not required, is preferably used in conjunction with preferred embodiments. An exemplary overlapping track arrangement is set forth by FIG. 3.

To write data, the head 112 is initially positioned so as to place the write element 134 in a substantially centered relationship over centerline 138, after which the head 112 writes the data to a first track 140 (Track 0). As will be recognized, the data on track 0 will have an initial radial width substantially equal to that of the write element 134.

On a subsequent rotation of the medium 110, the head 112 is advanced to substantially center the write element 134 over centerline 142. At this new position, the head is used to write data to a second track 144 (Track 1). Track 1 partially overlaps Track 0, but Track 0 retains sufficient remaining width to permit the read element 136 to read the data initially stored to Track 0.

Any number of additional adjacent tracks can be overwritten, or trimmed, in this manner. For example, by following centerline 146, a third track 148 (Track 2) can be partially overwritten onto Track 1; by following centerline 150, a fourth track 152 (Track 3) can be partially overwritten onto Track 2, and so on.

This partial overlapping of tracks can significantly increase the total amount of data that can be stored on the media 110. This is because the limiting factor on track density is generally no longer the effective width of the relatively wider write element 134, but rather the effective width of the relatively narrower read element 136.

An issue that arises with the use of such overlapping tracks, however, relates to the operational overhead that may be required in order to update data previously written to a set of such tracks. For example, in order to update the data on Track 1, merely aligning the write element 134 with centerline 142 and performing a new write operation to Track 1 will result in the undesired overwriting of the data previously stored to Track 2.

Thus, it may be necessary to perform an initial read operation to recover and temporarily buffer the associated contents of Tracks 2 and 3, write the new data to Track 1, and then rewrite the buffered data to Tracks 2 and 3.

Track 3 (or some other subsequent downstream track) can be maintained in a non-overlapped condition to serve as a boundary to the set of overlapped tracks. A subsequent track such as 154 (Track 4) can be written by aligning the write element 134 with centerline 156, which is a full write element width away from centerline 150. Track 4 thus abuts Track 3 in a substantially non-overlapping condition, and can be used as the first track in a second set of overlapping tracks next to the first set, or as an additional guard track to the first set.

The overlapping as presented in FIG. 3 is in a direction from the inner diameter (ID) to the outer diameter (OD) of the media 110 (see FIG. 1). However, the overlapping can alternatively move from OD to ID, as desired. It may be advantageous to overlap toward the ID near the ID and to overlap toward the OD near the OD. Thus, the term "downstream" will be understood to be a relative term with respect to the media and will indicate the radial direction in which additionally overlapped tracks are added in a particular set.

Figure 4:
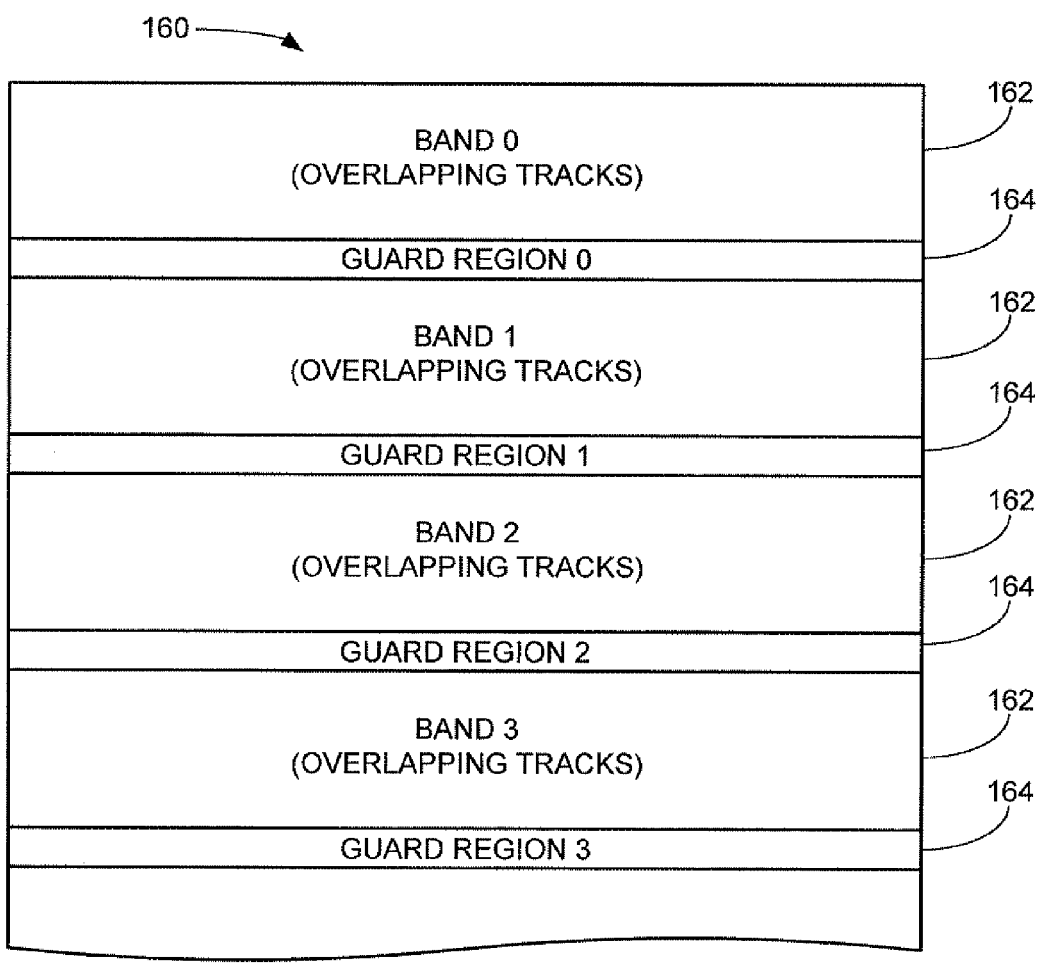
FIG. 4 provides a generalized structure for a portion of the physical space of the device of FIG. 1 utilized for the storage of user data.

1. Mutable Association of a Set of Logical Block Addresses to a Band of Physical Storage Blocks FIG. 4 shows a preferred manner in which data are arranged on each of the media recording surfaces in accordance with preferred embodiments. A plurality of bands 160 are defined, each preferably comprising a plurality of overlapping tracks 162 and a guard region 164 which separates each band from the next adjacent band.

The number of tracks in each band 160 and hence, the total amount of physical storage capacity in terms of fixed block sectors of each band can be set to an appropriate level. The total number of physical sectors in each band can also vary from one band to the next. As mentioned previously, in preferred embodiments the tracks in each set 162 are overlapping tracks as set forth by FIG. 3, but this is not limiting.

Figure 5:
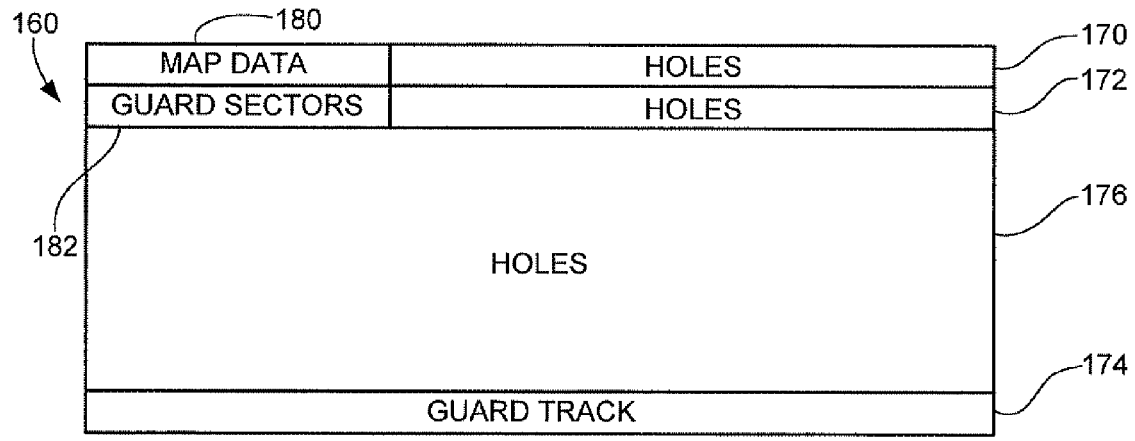
FIGS. 5-7 illustrate a selected one of the bands from FIG. 4 under different operational conditions.

Each band 160 is treated as a pool of physical sectors assigned to one or more particular range(s) (sets) of the logical (LBA) space. FIG. 5 shows a generalized representation of a selected one of the bands 160 of FIG. 4 in an initial, non-allocated condition.

For reference, it is contemplated that the band 160 in FIG. 5 constitutes a total of nine (9) tracks of which the first two are identified at 170, 172 and the last (guard) track is identified at 174. The third through eighth tracks of the band 160 are represented collectively at this point by a single "holes" block 176. For purposes herein, the term "holes" is a convenient term generally used to identify areas having sectors that have not yet been allocated for the storage of user data. Holes also describe areas with sectors that have been previously written to, but are now released for subsequent use.

Differences in relative "widths" of the tracks (e.g., overlapped v. not overlapped) are not depicted in FIG. 5. It will be readily apparent, however, that the guard track 174 forms at least a portion of the guard region 164 in FIG. 4, and is preferably at least twice as wide as the remaining tracks in the band 160. The guard track 174 can thus be safely written to (as desired) without fear of overlapping or erasing data from an adjacent band, or can remain unused.

Those skilled in the art will recognize that each track represented in FIG. 5 constitutes a discrete or spiral circular path around the associated medium 110, so that the band actually corresponds to a ring (or "donut") of physical area on the medium. This ring has been translated graphically to a rectilinear (Cartesian) representation in FIG. 5 to aid in the present discussion.

The full data contents of each track (from index or other angular reference point) can be viewed as extending from left to right in FIG. 5. If the tracks are discrete concentric circles on the media, once the head 112 reaches the far right side of FIG. 5, continued movement in this direction will immediately place the head 112 on the same track at the far left side of the diagram. Conversely, if the tracks are arranged in a continuous spiral, once the head 112 reaches the far right side of FIG. 5, continued movement in this direction will immediately place the head 112 on the next lower (downstream) track.

It is contemplated, albeit not required, that each track in a given band will generally have the same number of sectors; the associated sectors on each track will not necessarily be exactly angularly aligned from one track to the next, but such relative alignments of sectors from one track to the next can be readily determined.

Each sector (block) preferably has an associated physical block address (PBA) to enable the servo circuit to physically locate the sector. Such PBAs in the illustrative embodiment of device 100 can comprise, for example, Gray code and servo wedge count components (radial and angular addressing), headers, etc. For reference, an embedded servo scheme is contemplated but not shown in the figures.

Continuing with FIG. 5, a map data block 180 is shown to be preferably written to a portion of the first track 170. The map data block 180 generally stores a map of the content and status of the band 160, and is thus used to manage the band. Guard sectors 182 from the second track 172 are identified and reserved. These guard sectors 182 are immediately adjacent to the map data block sectors 180 on the medium 110, and are not available for use in storing data.

In this way, update writes can be freely made to the map data block 180 on the first track 170 without fear that data in the guard sectors 182 on the overlapping second track 172 will be inadvertently overwritten and lost.

FIG. 5 shows the block 160 in an initial, non-allocated state; that is, no writes have been made to any of the available physical sectors (holes). The available physical sectors include all of the sectors on the third through eighth tracks (block 176) as well as the remaining sectors on the first and second tracks 170, 172 not utilized as described above for the map data.

The total number of available physical sectors in the band 160 preferably comprises a number larger than the associated range of logical blocks (LBAs) assigned thereto. A one-to-one LBA to physical sector relationship is not predetermined, but rather is preferably established on the fly and is mutable (i.e., changes during operation as required). The management scheme utilized by the controller 126 (FIG. 1) to write data to the various bands exploits spatial and temporal localities to write quickly wherever space is available.

Figure 6:
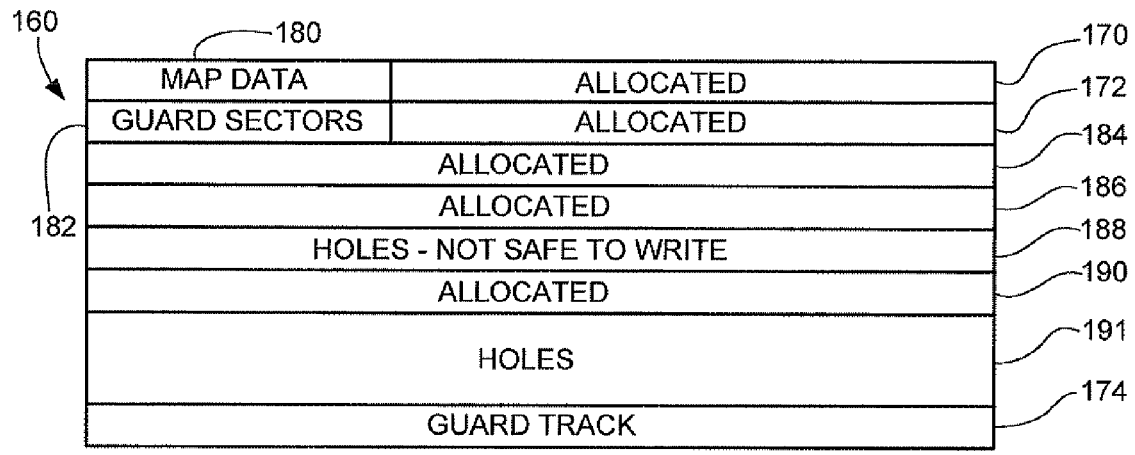

FIG. 6 shows the band 160 of FIG. 5 after a number of write operations have taken place, resulting in the allocation of the sectors in the first and second tracks 170, 172, third track 184, fourth track 186, fifth track 188 and sixth track 190.

More specifically, it can be seen that user data have been written to various sectors as indicated by the "allocated" legend in tracks 170, 172, 184, 186, and 190. This may have constituted a single relatively long write operation, or multiple consecutive and abutting writes. Additional data have been written to the sectors on track 190. It will be understood that the current example has contemplated that each of these write operations conveniently "fill" all of the sectors on each of these tracks. This is a highly simplified representation to aid in the present discussion, as those skilled in the art will appreciate.

Note that track 188 does not store user data, but is rather described by the legend, "holes—not safe to write." This is a result of the allocation of the downstream sectors of track 190; since user data now exist on track 190, attempts to write data to the upstream track 188 would likely result in the loss of the data on the downstream track in the embodiment of overlapping tracks.

This is generally not a problem, and indeed serves to illustrate an advantage of the management scheme by identifying an optimum location to which the data could be written to quickly. Depending on the circumstances, the data on track 190 could comprise the very first data written to the band 160, and the data on tracks 170, 172, 184 and 186 could have been written later.

The map data of block 180 serves to allow dynamic allocation of sectors based on the available space. As each set of LBAs are assigned for writing to the band 160, a table is maintained and updated to show which physical sectors are now allocated to store such LBAs (preferably by way of the aforementioned PBAs). As the data are written, the map is also updated to identify other considerations such as the upstream holes (e.g., track 188) to which data cannot be safely written, as well as remaining available holes (block 191) and the locations thereof within the band.

This provides a great deal of flexibility to the data management scheme; for random writes, the band 160 can be viewed as a high speed cache, whereas for sequential writes, the band 160 can be viewed as a circular buffer.

The management scheme further preferably schedules realignment activities (also referred to herein as "scrubbing") that can take place from time to time in the background to maintain the band 160 in an optimal state for the receipt of additional data. Such scrubbing can include defragmentization ("defragging") efforts to gather and accumulate holes into contiguous sets.

Figure 7:
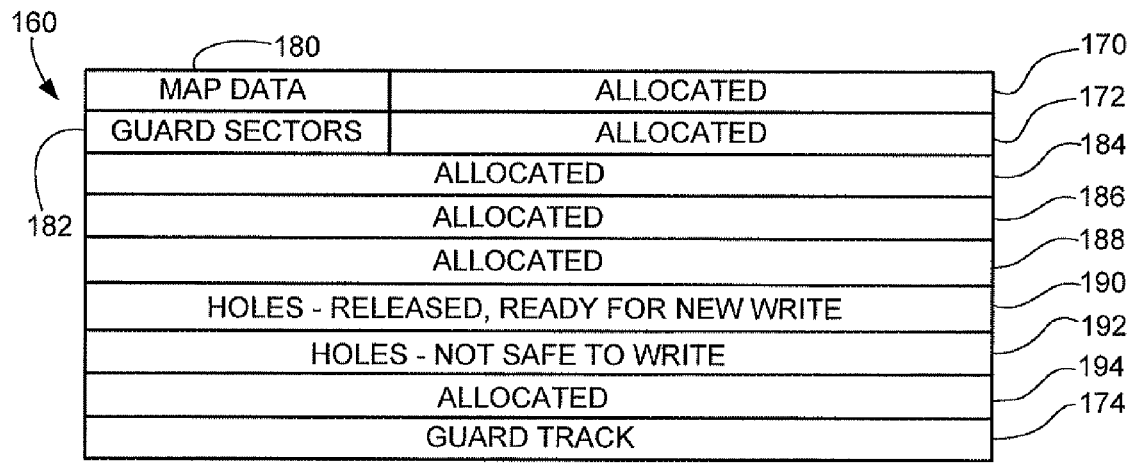

FIG. 7 shows a snapshot of the band 160 at a later time after additional actions have taken place with regard to the band. In FIG. 6, track 190 was allocated whereas in FIG. 7, track 190 is now released and ready for a new write. This may have arisen as a result of a new command to write new updated data to the band 190, which resulted in the release of the older version of data on track 190. Alternatively, scrubbing operations may have taken place to buffer and rewrite the data from track 190 to another track, such as track 188.

It can be seen that such operations can continuously alter the LBA-physical sector relationship; a particular LBA stored in a first sector in FIG. 6 may now be stored in a different, second sector in FIG. 7. Such realignments are preferably wholly transparent to the host device.

The sectors on track 190 are now free to receive new data, as indicated by the legend, "holes—released, ready for new write." Preferably, the magnetization pattern of track 190 remains identical in both FIGS. 6 and 7; that is, there is no need to go in and perform a DC erase or other action upon track 190. Track 190 can thus simply wait until the next write operation which will serve to reorient the flux transition patterns thereon in view of the new data, as well as trim the upstream sectors on track 188.

It can be appreciated that if it is advantageous to perform actions on the medium before data are written, then such action can take place on the holes making them ready for a new write, and since this action can take place before the host write command the drive operation can be improved. The improvement may be in the reliability of writes that have the action applied before the write and/or the speed of the writes by not requiring the action after the host command is received.

FIG. 7 also shows that an additional write has taken place upon the eighth track 194, as indicated by the legend, "allocated." As before, the immediately upstream track 192 is now statused as, "holes—not safe to write."

At this point there are two tracks of holes (tracks 190, 192), but only one of these tracks (i.e., track 190) can be used to accommodate new writes. A scrubbing operation to move the data on track 194 to track 190 would advantageously make both tracks 192 and 194 available for write operations ("holes—released, ready for new write").

FIG. 8 provides a generalized representation of the mutable mapping between logical blocks (LBAs) in the logical space and physical blocks 200 (e.g., sectors) in the physical space. The physical blocks (sectors) need not be the same size as the logical blocks.

This allows a great deal of flexibility with regard to the writing of logical blocks. As shown by FIG. 9, various styles of write operations can be accommodated, even within the same band. One block writes on even and odd boundaries are shown at 202 to correspond to physical sectors 0 and 1. In this case, LBA 0 (followed by fill data) is written to sector 0, and LBA 3 (followed by fill data) is written to sector 1. The fill data are used based on the fact that the sectors are preferably twice the size of each LBA (e.g., 1024 bytes v. 512 bytes, etc.). However, in alternative embodiments the sectors and LBAs can each be the same size (e.g., 512 bytes, etc.).

Two block writes on even and odd boundaries are shown at 204. This entails LBAs 6 and 7 being written to physical sector 2, and LBAs 9 and 10 being written to physical sector 3.

Three block writes on even and odd boundaries are shown at 206, with LBAs 12 and 13 written to sector 4, and LBA 14 followed by fill data to sector 5. Sectors 6 and 7 constitute holes and have been skipped in FIG. 9. A four block write on even and odd boundaries is indicated at 208 with LBAs 17 and 18 to sector 8 and LBAs 19 and 20 to sector 9.

The bands 160 also readily facilitate the use of localized error correction layers such as super parity (SP) values. As shown in FIG. 10, a super parity operation 210 is depicted whereby 16 blocks of logical data (0-15) are written to sectors 0-7, and SP values (codes) are stored in sector 8. As will be recognized, SP values are calculated in accordance with a selected algorithm to provide a particular numeric result.

Upon recovery of the base data, a second SP value can be calculated therefrom and compared to the stored value; if these values are the same, accurate recovery of the base data is confirmed. Also, some SP values allow up to a selected amount of the original host data to be reconstructed if errors occur during retrieval of the data from the media.

Based on the flexibility provided by the bands 160, any number of super parity (or other multi-block data integrity enhancements) can be applied, including multiple levels thereof. While preferred, it is not necessary that the associated protected blocks, or the SP values calculated therefrom, be located contiguously within the band 160. Instead, such can be distributed throughout the band 160 as required.

Additional assurance levels can be provided to certain data within the band by locking out the immediately downstream, adjacent sectors. For example, the SP values in sector 8 of FIG. 10 can be accompanied by the temporary designation of the adjacent sectors in the downstream track (not shown) as guard sectors. In such case, the guard sectors are designated as "holes—not safe to write," and do not receive data written thereto. It will be recognized that this results in the SP values retaining a full write element width (FIG. 3) while the SP values remain utilized by the system.

Figure 11:
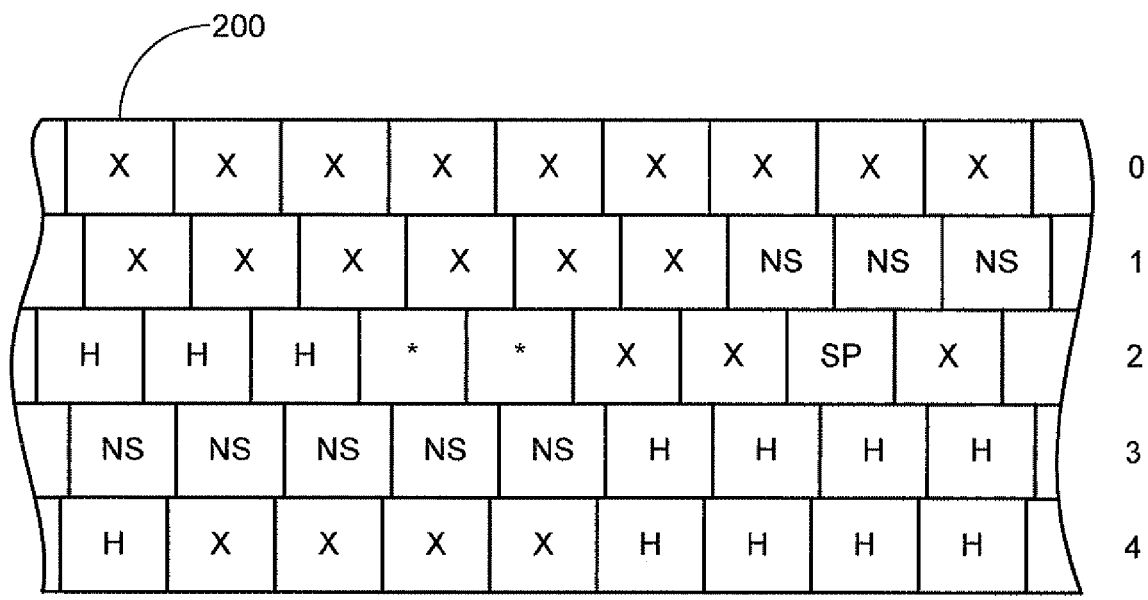
FIG. 11 shows a number of adjacent sectors in a selected band.

FIG. 11 provides another representation of a portion of the band 160. Portions of five (5) adjacent tracks (arbitrarily denoted as Tracks 0-4) are shown with a number of associated sectors thereon. The status of each of the sectors 200 in FIG. 11 are keyed as shown in FIG. 11: "X" represents allocated sectors to which user data have been stored and remain linked to logical blocks by the map data. "H" represents sectors characterized as holes, ready for allocation.

"NS" represents hole sectors that are not safe to write on the basis of immediately adjacent allocated sectors. "SP" represents sectors that store super parity (or other data integrity) codes. Stars represent sectors that form a portion of a super parity group and in which the data have been released. However, because these sectors form a portion of a super parity group, the data therein must be retained to facilitate recovery of the remaining sectors of data in such group.

From FIG. 11 it can be seen that the sector boundaries do not necessarily align angularly on the medium 110. It is thus contemplated that the map data will maintain an accurate indication of the relative alignments track-to-track of the various sectors 200. In this way, the four sectors of user data ("X") on Track 4 are properly protected by the adjacent five (5) sectors of "not safe to write" holes ("NS") on Track 3.

At any given time, the status of a particular hole will depend upon the write status of the immediately downstream sectors, whether that hole forms a portion of a super parity block, and so on.

The scrubbing operations that are scheduled and performed are preferably arranged in a hierarchical format, with lower level housekeeping tasks being preferably added to an "idle service" queue, so that these can be carried out whenever the device 100 enters an idle period of operation (i.e., no pending host commands).

Some realignment operations may increase in importance to the point of necessity so as to require scheduling as part of an existing command queue sorting strategy. Such condition may arise, for example, because a timeout condition has been reached, or because the total remaining amount of available storage in a given band has reached a selected threshold. In such cases, it may become necessary to temporarily suspend host I/O operations until these conditions can be resolved.

An optimum scrubbing strategy can be devised depending upon the requirements of a given application. For example, point of sale (POS) types of applications may involve periods of high data rate burst activity followed by sufficient amounts of idle time to allow the controller 126 to adequately address most of the scrubbing operations in the background. Streaming applications, such as with A/V data, may employ secondary buffers to allow host I/O to continue uninterrupted while the scrubbing management operations are carried out.

Figure 12:
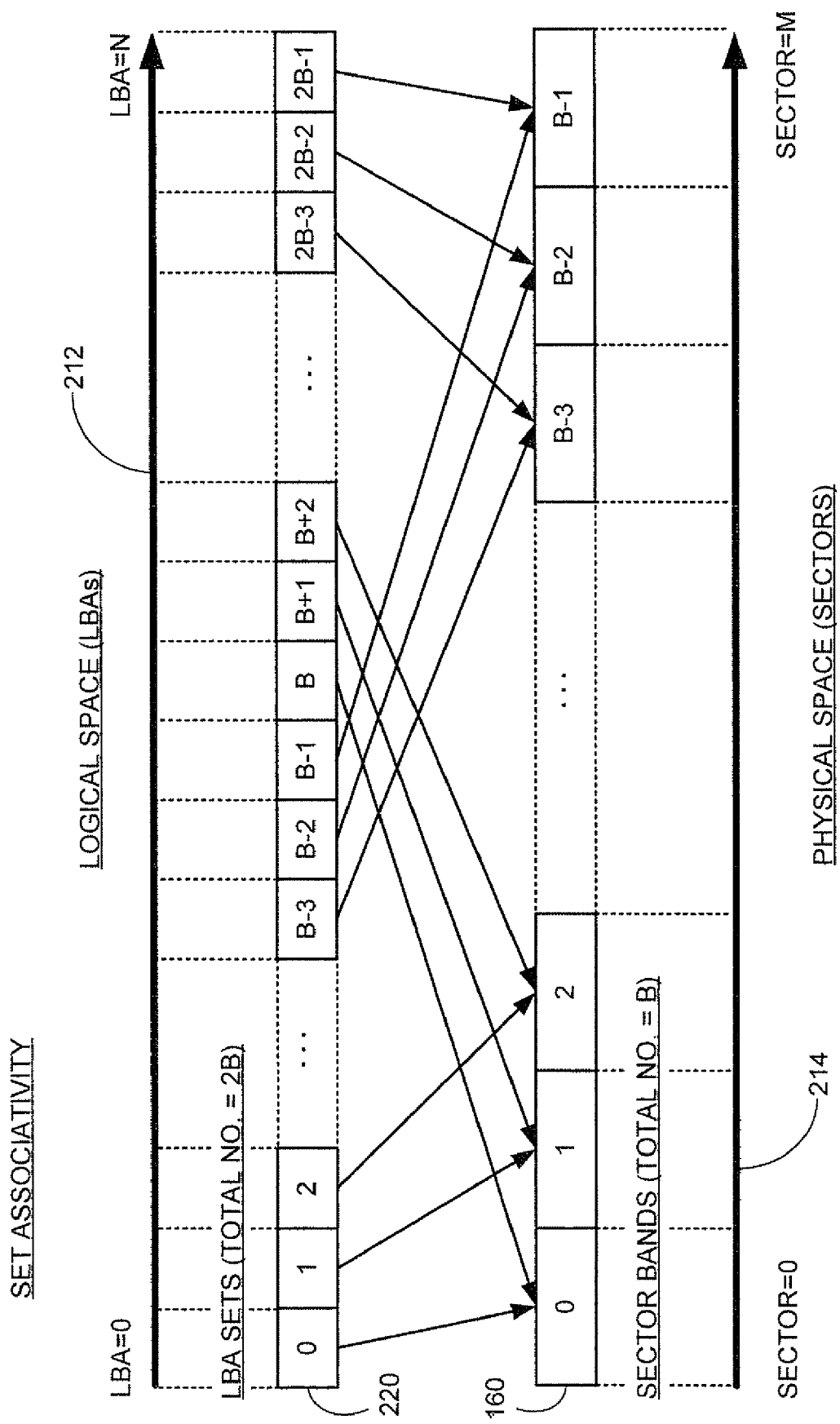
FIG. 12 sets forth a preferred set associativity approach for mapping from the logical space to the physical space.

FIG. 12 provides a detailed diagrammatical representation of a preferred relationship between the logical space and the physical space. Range 212 depicts a preferred representation of the logical space, arranged as a sequence of logical blocks (LBAs) from LBA=0 to LBA=N. Preferably, this is a level at which a host device (or other mechanism) arranges and requests data.

Range 214 depicts a preferred representation of the physical space, arranged as a sequence of physical blocks (sectors) of the device 100, from sector 0 to sector M. M is greater or equal to N. It should be noted that the values M and N may constitute all, or merely a portion of, the possible data spaces used with the device 100; in other words, there may be additional sectors and logical block ranges that are dealt with in a substantially conventional fashion apart from the bands 160.

The associated range of sectors 0 to M are preferably distributed among a number B of bands 160 on the media 110, as shown. The number B can be any suitable value. These bands are denoted in FIG. 12 as band 0 to band B−1, and each preferably accommodates M/B sectors.

The associated range of logical blocks 0 to N are preferably distributed among a number 2B of sets 220. The sets 220 range from set 0 to set 2B−1 as shown. Each set preferably accommodates 2B/N logical blocks. The number of sets is preferably set as an integer multiple of the number of bands (in this case, 2×), although other types of applications may utilize a different multiplier (e.g., 16×, etc.). Non-integral relationships can also be used.

From FIG. 12 it can be seen that two sets 220 of LBAs are associated with, or assigned to, each band 160. In this illustrative example, the LBAs in set 0 and set B map to the physical sectors of band 0; the LBAs of set 1 and set B+1 both map to the physical sectors of band 1, and so on.

This advantageously serves to spread the spatial locality of the logical space, allowing exploitation of the distribution of LBA accesses. Using a very simple example, assume each set 220 in FIG. 12 comprises 1,000 sequential LBAs from the range 212. That is, set 0 corresponds to LBAs 0 to 999, set 1 corresponds to LBAs 1000 to 1999, etc. It will be appreciated that real world applications will tend to use substantially larger values than these.

It can be seen that data storage requests from the host with regard to the first 2,000 LBAs will be spread out across the physical sectors of bands 0 and 1, which in combination have sufficient space to accommodate at least twice this capacity (e.g., 4,000 LBAs in this example).

Accordingly, during a burst period when large amounts of activity are provided for this LBA range (i.e., LBAs 0 to 1,999), there will generally be sufficient space to accommodate a large number of successive write operations, including updated writes with very little overhead or other delays. This is generally true regardless whether the accesses are sequential or non-sequential from an LBA standpoint.

More particularly, if a sequential "burst" transfer of all 2,000 LBAs is commanded, the controller 100 can move the head 112 to the first available hole in band 0 and begin writing the first 1,000 LBAs to sectors in a burst mode. There is no need to seek to the "particular" sector assigned to the beginning LBA in this band, because such assignment preferably does not exist. Rather, the assignment is made on the fly and recorded by the map data. As the tracks within the band are filled with user data, very fast one track seeks are performed (if the tracks are discrete, concentric tracks) and the process continues until all of the first 1,000 LBAs have been written.

The controller 126 then moves the head 112 to band 1 and repeats for the second 1,000 sectors in the access.

On the other hand, if the transfer is more sporadic (including reverse sequence writes, reads, updated writes, etc.), as before the controller 126 locates the first available hole in the associated band 160 and begins writing data. Read requests for just-written data are preferably satisfied directly from write cache (block 124, FIG. 2), or are carried out by moving the head 112 to re-read the previously written data within the band 160.

Significantly, if a command has been processed to write a first subset of these LBAs (e.g., LBAs 50-99), and a new command is provided to rewrite these LBAs with new, updated data, this new set of data is preferably not overwritten onto the physical sectors that store the first set. Rather, this new set of data is preferably written to a new set of sectors within the band 160, and the old set is simply released back to the pool of available sectors (e.g., as with track 190 in FIG. 7).

This can significantly reduce latency times by eliminating the need to move the head back to the first set of physical sectors that store the older version of the LBA data. This also eliminates the need to buffer any overlaid data on a downstream adjacent track, write the data to the first set of physical sectors to replace the old LBA data with the new LBA data, and then replace the buffered data on the downstream track(s) as discussed previously with FIG. 3.

In some embodiments, the set associativity of FIG. 12 is adaptive and modified in response to detected access history. If a large locality of LBA accesses with a first band reaches a point where that band is becoming full (or otherwise in need of substantial scrubbing), a decision can be made on the fly by the controller to simply move to a new available band on the media and distribute some or all of the affected data. Thus, scrubbing operations can extend to multi-band operations, as required.

Moreover, if the types of accesses are such that a given ratio of sets to bands is deemed sub-optimum, the LBA sets can be reconfigured to a more suitable resolution (e.g., from 2× to 4× for all or merely some of the sets and bands).

Figure 13:
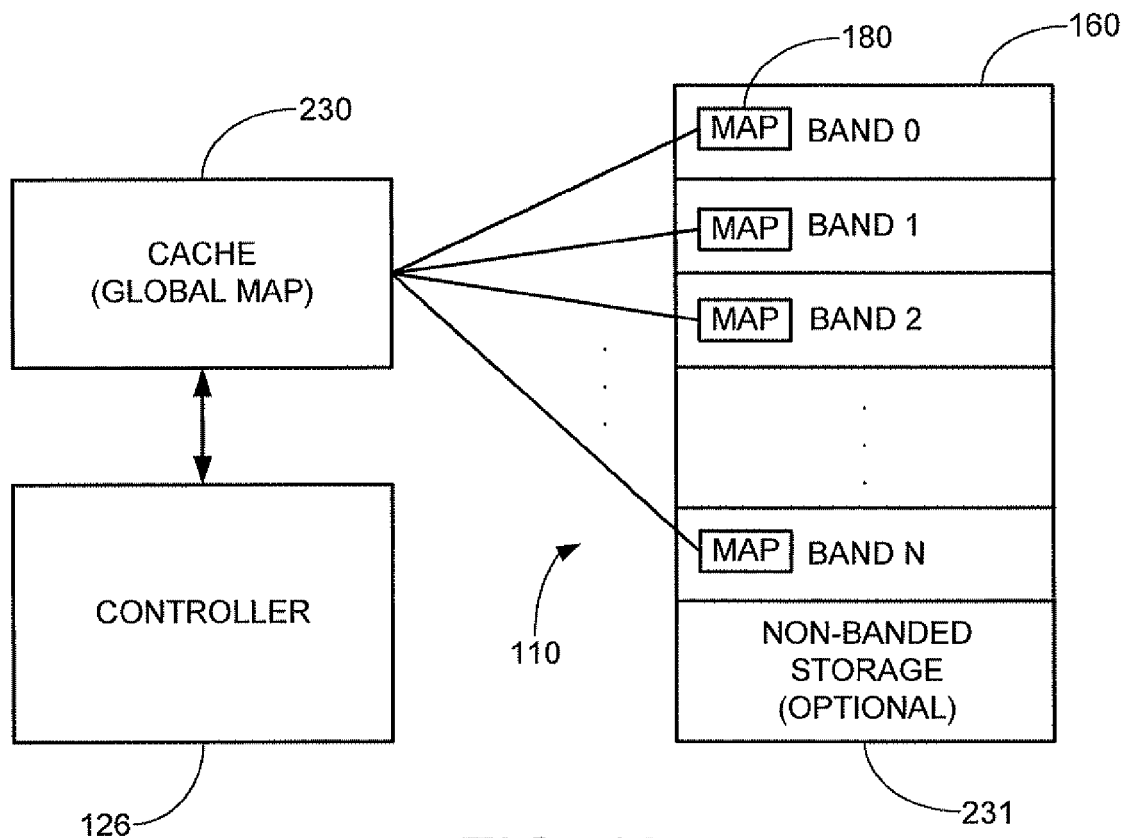
FIG. 13 generally illustrates a preferred manner in which cache map management is preferably carried out by the controller of FIG. 2.

FIG. 13 illustrates a preferred manner in which the controller 126 manages data accesses with the bands 160. Upon initialization of the device 100, the contents of the respective map data blocks 180 are preferably loaded into a suitable memory location 230 to provide a global map data structure for use by the controller 126. This memory location 230 preferably comprises a portion of the buffer of the interface circuit 124, although dedicated memory (including non-volatile memory such as flash) can also be used.

This global map structure maintains a master set of the map data in the form of an accumulation of the map data for each of the individual bands. The global map structure is updated in real time (or near real time) to reflect data transfer operations and scrubbing operations on the sectors 200 in the various bands.

At appropriate times during processing, the controller 126 provides updates back to the map data blocks 180 in each of the bands 160. History logs or other metadata tracking and recovery techniques are preferably implemented to maintain the integrity of the latest map data in case of a power or operational interruption of the device 100.

It is contemplated that the map data for each band 160 will be relatively small (e.g., 2-4 sectors, etc.). Nevertheless, if a large number of bands is utilized, such a global map structure may become unwieldy or undesirable. Hence, in an alternative preferred embodiment, the controller 126 accesses the contents of the data map block 180 at the commencement of each action associated with that band, and the memory structure 230 loads the associated data for that band. As desired, a buffer arrangement (such as a FIFO) can be used so that the map data for recently accessed and/or frequently accessed bands are maintained locally, and others are retrieved as needed.

FIG. 13 also shows that the bands 160 can comprise less than all of the available data capacity of the media 110, in which case a non-banded storage area 231 receives data access operations by the controller 126 in a conventional fashion.

Figure 14:
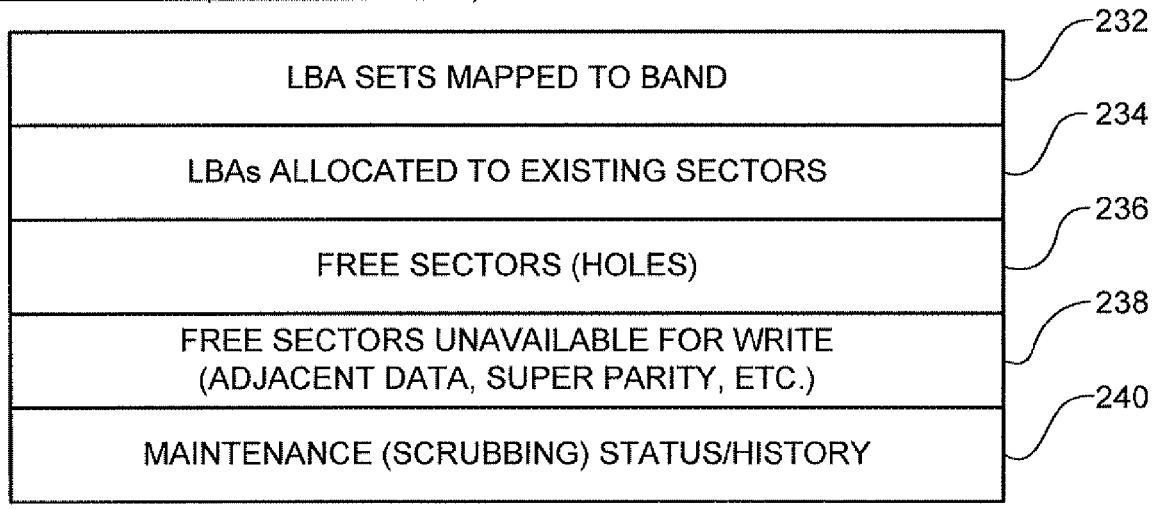
FIG. 14 sets forth a generalized preferred map format for each band.

FIG. 14 provides a generalized illustration of a preferred format for the map data in each block 180. Such data preferably include a listing of which LBA sets 220 are currently mapped to the associated band 160, as shown by block 232. For example, with reference to FIG. 12, this portion of the map data for band 0 will identify sets 0 and B as being linked to band 0. This list may also provide a global list of all set associativities for all band/set combinations, but for efficiency only a single such list is preferably maintained by the controller 126 in the global data structure.

Block 234 represents a table or other associative structure that cross-references which LBAs are allocated to which physical sectors within the band 160 at any given time, block 234. The LBAs are preferably referenced by logical block number (e.g., 0 to N in FIG. 12). The sectors 200 can be individually identified by physical address using track address (Grey code) and angular location counting from index, as is commonly employed by the servo circuit 132.

Alternatively, the sectors 200 in each band can be assigned a band address, such as numerically designating the sectors as sectors 0 to (M/B−1), and then a separate conversion mechanism can be used to convert this address to a servo address. Regardless, the data of block 234 allows the controller 126 to readily indicate which physical sectors 200 from the physical space 214 are presently used to store which LBAs from the logical space 212.

FIG. 14 next shows the map format to preferably include a list of free sectors (holes) ready for allocation, block 236. Such holes are exemplified at 170, 172 and 176 in FIG. 5, at 191 in FIG. 6, and 190 in FIG. 7. Since the management scheme is preferably configured to identify suitable locations where writes can take place quickly, this block 236 further preferably identifies the sizes of contiguous sets of the available sectors within the band 160.

In such case, each entry of block 236 can include the address of the first physical sector in each contiguous set, followed by a number indicating the total number of adjacent available sectors in that set. For example, if physical sectors 200 through 550 are available and contiguously arranged within the band 160, a suitable entry can be 200:350 (first sector):(total no. of sectors immediately following the first sector).

This allows the controller 126 to sort the list, such as by descending order, and make intelligent decisions on where to place each new block of write data. It is contemplated that contiguously arranged available sectors that span multiple tracks will be grouped together into a single large set, but these can also be arbitrarily grouped in a manner best suited for the operational environment. The available sectors within a contiguous set may also be limited to sectors on a single track, thereby reducing the need to carry out a one-track seek during the write operation.

As sectors are allocated for use in the storage of logical blocks, the controller 126 updates the data of block 234 to show the new LBA-physical sector assignment, and updates the data of block 236 to remove the associated sectors from the free list.

The map format further preferably includes list of sectors that are not available for allocation due to a protected status, block 238. This was discussed previously with regard to the "holes—not safe to write" sectors at 188 in FIG. 6 and at 192 in FIG. 7, as well as the "NS" and "star" sectors in FIG. 11. As before, these designations are determined in response to the allocation (or deallocation) of sectors by the controller 126.

It will be recalled that the sectors 200 in each band 160 will not necessarily align angularly, as represented by FIG. 11. Thus, some additional amount of data may be required to accommodate these offsets, such as an adjoining table that identifies, for each sector, the adjoining sectors on the immediately upstream track. In this way, a write to a given sector allows the affected sectors on the upstream track to be identified and placed in a write protect mode.

Block 240 of FIG. 14 provides a maintenance (scrubbing) block that provides status and history information with regard to housekeeping actions on the band 160. The block 240 preferably tracks various statistics and accumulates a list of required actions to realign the data that can be carried out by the device 100 when time permits. The block 240 can also be used to set warning flags or interrupts when the band 160 reaches a point where scrubbing must take place in the near or immediate future.

From the foregoing discussion it will be appreciated that the various preferred embodiments discussed herein provide an improved data management scheme with several operational advantages over the existing art. By arranging groups of physical sectors into bands (such as 160), and mutably associating sets of logical blocks (such as 220) to each band, significant performance enhancements can be achieved.

While some preferred embodiments do not utilize overlapped tracks within the bands, it will be recognized that the management scheme is particularly suited to such overlapped tracks. It is thus preferred that all, or at least some, of the bands will utilize overlapped tracks. For example, the device 100 can be configured with some bands with overlapped tracks and other bands with non-overlapped tracks.

The bands with overlapped tracks are particularly suitable for streaming accesses, and such can be directed to these bands. The bands with overlapped tracks can also serve as an archive (backup) role by accumulating data stored elsewhere on the drive and efficiently packing such together into one or more bands. The entire device 100 can utilize overlapped tracks and accommodate all types of data accesses, which provides a significant improvement in the overall data storage capacity of the device. Band and set configurations can be established during manufacturing or during field use, including switching from non-overlapped to overlapped tracks as desired.

By providing each band with a number of physical sectors that is greater than the associated number of logical blocks (LBAs) for that band, dynamic sector allocation techniques can be used as discussed above to allocate sectors as needed. This is particularly useful with overlapped tracks since the need to buffer and rewrite downstream tracks, as discussed with respect to FIG. 3, can be largely avoided.

Defect management operations are also greatly simplified by this approach; if a defective sector is located in a given band, the defective sector can simply be given a permanent designation of "not safe to write." There is no need to allocate an alternative sector for the defective sector since no pre-established one-to-one LBA-physical sector correspondence is used to begin with. This can allow a relaxing of the requirements of manufacturing certification testing of new drives.

Off-line scans or other defect detection methods can be carried out at appropriate times as before to identify defective sectors. However, under certain conditions the requirements of manufacturing certification testing of new drives may be able to be relaxed.

Problems associated with adjacent track interference are also largely eliminated by the preferred management scheme. As will be recognized, high numbers of repeated write operations to a given track can, over time, render data stored to the adjacent tracks unreadable as a result of the cumulative effects of fringe recording fields from the write element 134. The various preferred embodiments eliminate this since update writes are generally distributed across the band; moreover, the accumulation of statistics can alert the controller that an unusually high number of small writes are taking place in a particular LBA range, allowing the controller to take additional adaptive actions such as moving some or all of these writes to another band.

Write caching is preferably carried out to service write commands. The controller 126 preferably accumulates write commands from the host, reports command complete to the host, and schedules the writing of the data at a suitable time in the near future. Preferably, the writes are grouped by band and streamed to the bands in turn.

Read caching is employed when available. If a read command requires media access, translations are carried out to sequentially identify the associated band and then the associated sector(s) within that band that store the requested data. The controller 126 schedules movement of the head 112 to retrieve the data, and the recovered data are then forwarded to the host.

An illustrative example will now be given for a device such as 100 configured in accordance with the foregoing discussion. Using a 250 gigabyte (GB) drive with about 273 GB of native capacity, it is contemplated that about 1% of the available capacity will be required for conventional overhead, and about 7.5% of the available capacity will be required for the management scheme (including guard regions, map data, extra sectors in each band, etc.).

Zone based recording is utilized, and bands are preferably retained within the same zone (i.e., do not cross recording-zone boundaries). There will be about 500-1000 1 kilobyte, KB (1024 bytes) sectors per track. The bands may be set at about 32 megabytes, MB each, with each band having about 64,000 sectors. In this case, the total number of bands will be on the order of around 7500, and each band may have on average around 100 tracks or so.

While the foregoing preferred embodiments have employed multiple bands, it will be readily appreciated that such is not necessarily required. That is, depending upon the requirements of a given application, a single band could be used. The terms "logical block address (LBA)" and "physical block address (PBA)" are defined broadly as describing an addressing scheme sufficient to identify respective blocks from a logical space and a physical space, respectively, and not merely limited to existing schemes or standards employed in the data storage industry.

For purposes of the appended claims, the term "mutably associating" and the like will be understood consistent with the foregoing discussion to describe an association that can change in response to operational conditions, such as exemplified by the assignment of an LBA to a first sector within a selected band, and then a subsequent reassignment of said logical block address to a second sector within said band.

The recited first means will be understood to correspond to the controller 126 of FIG. 2 configured to direct operation of the device 100 in accordance with the various diagrams of FIGS. 3-14, including applications utilizing a single band or multiple bands.

2. Defect Management

As indicated earlier, the above-described embodiments, in general, enhance the potential for simplification of defect management operations in data storage systems, such as disc drives. However, prior to describing specific defect management techniques in accordance with the present embodiments, some background information about defect management in data storage devices or block storage devices, such as disc drives, is provided below.

In the field of block storage devices, defective blocks (defects) must be mapped out from the logical to physical mapping. Most systems distinguish between defects found in the factory and grown defects discovered in the field. Factory-time defects are typically mapped out by skipping the defective blocks and resuming the logical sequence on the following non-defective sector, thus maintaining logically sequential accesses on the same track and in rotational order; this methods is commonly known as skipping. Grown defects, in contrast, are typically mapped to physical locations that are not physically proximate; this method is commonly known as alternating. Alternating, however, causes substantial performance loss when accessing the logical sequence of blocks that include a grown defect. The performance loss is most critical in applications sensitive to sequential access rates such as emerging audio and visual markets.

In current disc drives, sectors with grown defects are mapped to reserved spare sectors. Establishing a pool of reserved spare sectors, maintaining the pool of reserved spare sectors, and utilizing of the spare sectors to replace sectors with grown defects is relatively complex.

In general, for both disc drives and solid state data storage devices that have no moving parts, the present embodiments carry out defect management without using spare sectors. The elimination of spare sectors obviates a need for utilizing different processes for handling factory-time defects and grown defects. Thus, the following defect management embodiments do not distinguish between factory-time and grown defects.

Figure 15:
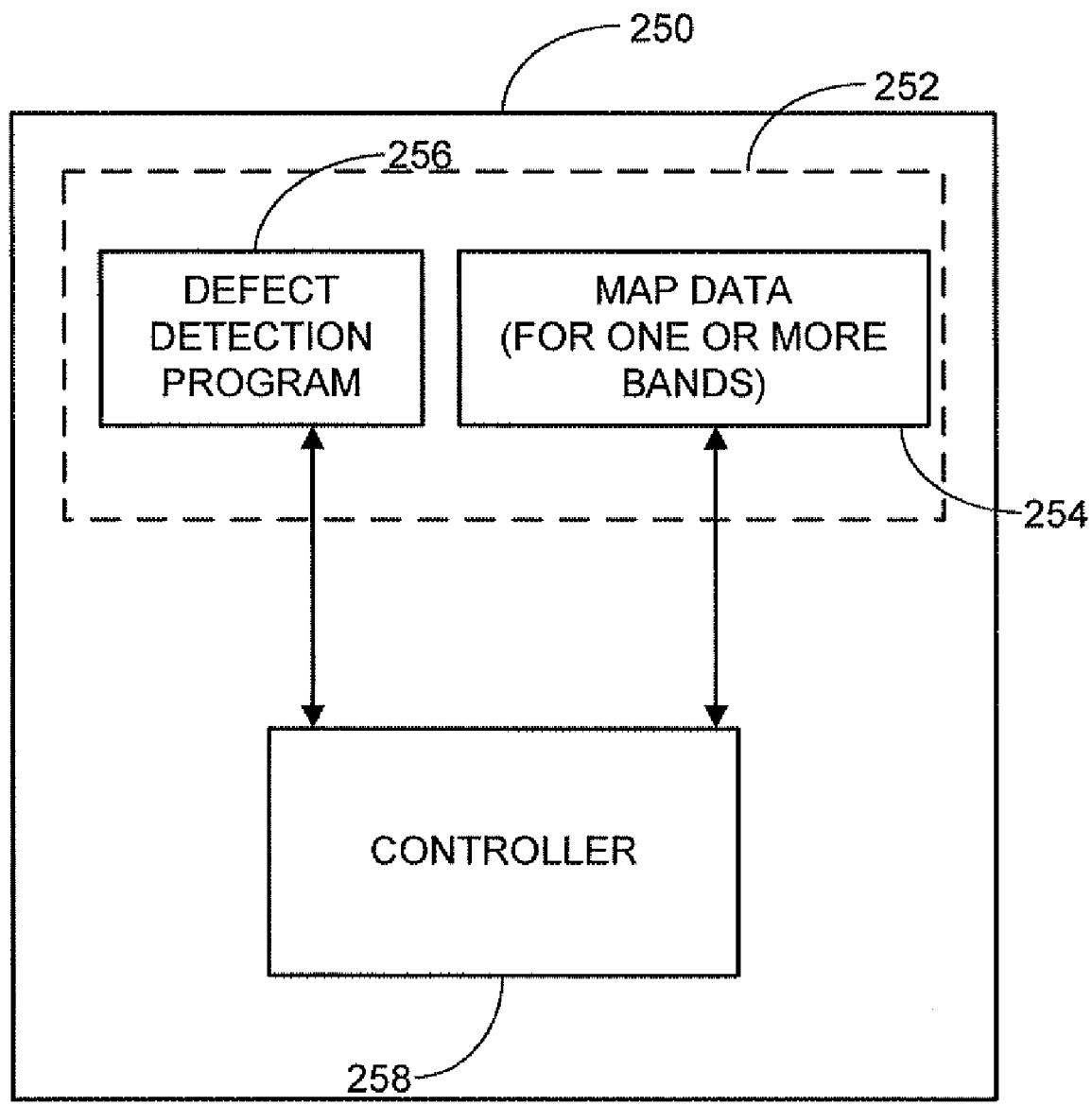
FIG. 15 is a simplified block diagram that shows components of a block storage device that are configured to carry out defect management in accordance with the present embodiments.

FIG. 15 is a simplified block diagram that shows components of a block storage device that are configured to carry out defect management in accordance with the present embodiments. In the embodiment shown in FIG. 15, map data 254 that tracks the allocation of physical blocks is stored on any suitable medium or memory 252 in block storage device 250. Although map data 254 is shown only as a single global map, it includes data that associates LBAs and PBAs for multiple bands in the physical storage space. Also stored in the block storage device 250 is any suitable defect detection program 256. Defect detection program 256 is executed by controller 258, which also maintains map data 254. In block storage device 250, with the help of controller 258, deallocation and new allocation can be carried out for each new write. By suitably updating map data 254 when defect detection program locates a defective block, controller 258 essentially simply removes defective blocks from the pool of space available for allocation. Controller 258 can thus make an optimal logical to physical mapping for each allocation, treating old and new defects alike. This encapsulates defect management in an allocation layer and removes all defect handling requirements from the lower block access layer. This improvement, in general, simplifies defect management and avoids discontinuities of access due only to grown defects by simply skipping a block that has a grown defect as shown in Table 1 below.

TABLE 1

| Logical | 0 | 1 | 2 |          | 3 | 4 | 5 | 6 | 7 | ... | 999 |
|---------|---|---|---|----------|---|---|---|---|---|-----|-----|
| Physical| 0 | 1 | 2 | 3 (defect)| 4 | 5 | 6 | 7 | 8 | ... | 1000|

Table 1 above is an example of a logical to physical mapping that skipped block 3, which has a grown defect. This is an example of a mapping state after a re-write is carried out as described above in connection with FIG. 15.

Figure 16:
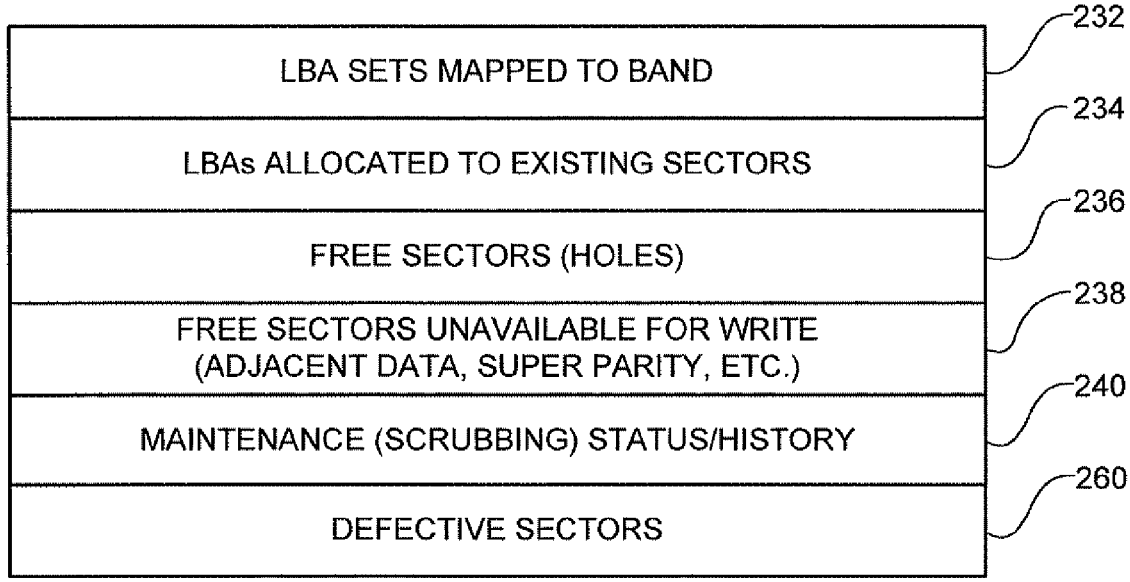
FIG. 16 provides a generalized illustration of an example format for map data, which includes a separate designation for defects.

FIG. 16 provides a generalized illustration of an example format for map data 254 (for a single band, such as 160), which includes a separate designation for defects. Other than defect identification block 260, blocks included in FIG. 16 are substantially similar to the blocks of FIG. 14 and are therefore denoted by the same reference numerals. Block 260 includes a list of defective physical blocks, each of which were included in the list as a result of the controller associating a PBA of the respective physical block with a defect status, for example, that reflects that the physical block is permanently unavailable for association with any individual LBA. It should be noted that, in some embodiments, instead of utilizing a different status for a defective block, any defective block is simply designated as not safe to write and included in block 238. Such embodiments would not include a separate block 260 for defective sectors. In addition to the earlier-discussed advantages, further improvements that can be made over current data storage device manufacturing requirements with the present embodiments are discussed below.

In current disc drives, physical blocks are certified as part of the manufacturing process. The certification process involves determining whether individual physical blocks on the storage medium are suitable for writing. As noted earlier, in the present embodiments, no distinction is made between factory-time defects and grown defects and therefore certification of at least a portion of the physical blocks (in disc drives and other block storage devices such as solid state data storage devices) can be carried out by a controller (such as 258) subsequent to manufacture of the device and once it is in the field. In such embodiments, before certification is complete for a given band, its use is restricted. In one embodiment, the uncertified physical blocks are not used at all prior to certification. In another embodiment, the uncertified physical blocks are used with recording methods that increase the reliability of the stored data. Such methods include reduced magnetic density (increased spacing) and redundancy. While the higher reliability recording methods may represent overhead that is unacceptable for the whole life of the device, they may be acceptable for storing a limited amount of data early in the life of the device before all physical blocks are certified and before all of the capacity is needed. Examples of logical to physical mappings in embodiments in which certification is carried out in the field are provided in tables 2 and 3 below. In tables 2 and 3 below, the certified physical blocks are marked "cert."

TABLE 2

| Logical  | 0    | 1    | 2    | 3    | 4    |   |          |   |   |   |    |
|----------|------|------|------|------|------|---|----------|---|---|---|----|
| Physical | 0 cert | 1 cert | 2 cert | 3 cert | 4 cert | 5 | 6 (defect) | 7 | 8 | 9 | 10 |

Table 2 above is an example of a logical to physical mapping which allocated five logical blocks to the first five physical blocks. In the above example, physical blocks 5 through 10 are not certified and therefore the controller does not know yet that block 6 is defective. However, a lack of knowledge of a defect in block 6 does no have any negative impact on the allocation process since block 6 is not certified and therefore not available for allocation.

TABLE 3

| Logical  |        |        |        |        |        | 0      |          | 1      | 2      | 3      | 4      |
|----------|--------|--------|--------|--------|--------|--------|----------|--------|--------|--------|--------|
| Physical | 0 cert | 1 cert | 2 cert | 3 cert | 4 cert | 5 cert | 6 (defect) | 7 cert | 8 cert | 9 cert | 10 cert |

In Table 3, after a certification process is carried out for the remaining blocks, block 6 is found to be defective and is therefore unavailable for allocation. Table 3 is an example of a logical to physical mapping which deallocated the logical to physical mapping shown in Table 2 and then allocated the five logical blocks to the next five non-defective physical blocks.

Figure 17:
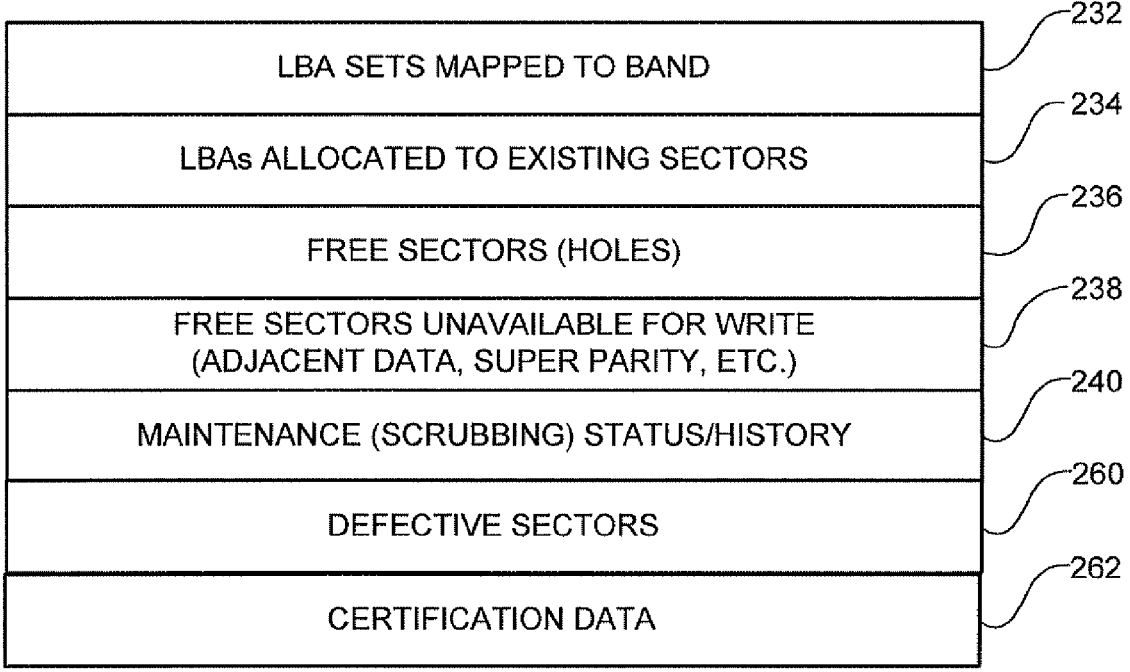
FIG. 17 provides a generalized illustration of another example format for map data, which includes a separate designation for certification status of physical blocks.

FIG. 17 provides a generalized illustration of another example format for map data 254 (for a single band, such as 160), which includes a separate designation for certification status of physical blocks. Other than certification status identification block 262, blocks included in FIG. 17 are substantially similar to the blocks of FIG. 16 and are therefore denoted by the same reference numerals. Block 262 includes data indicative of a certification status of physical blocks. As indicated above, certification of physical blocks is carried out by a controller (such as 258), which executes defect detection program 256, and suitably updates data in block 262. As in the case of the embodiments discussed in connection with FIG. 16, a list of defective physical blocks can be included in block 260 or simply designated as not safe to write and included in block 238. In general, supporting certification in the field significantly reduces manufacturing process times and thereby provides a large advantage to a manufacturer.

Figure 18A:
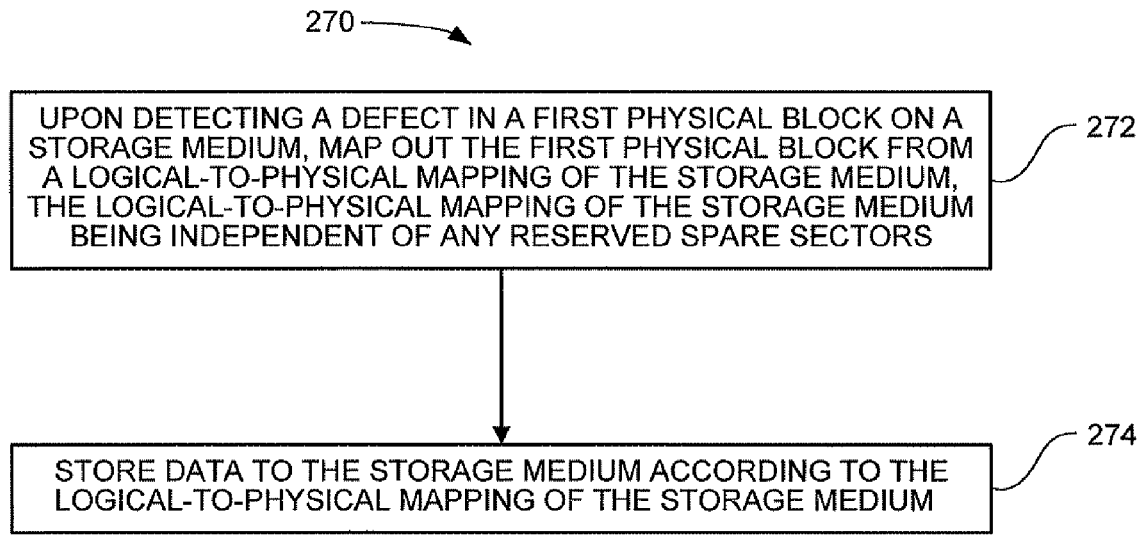
FIGS. 18A and 18B are simplified block diagrams of method embodiments.
Figure 18B:
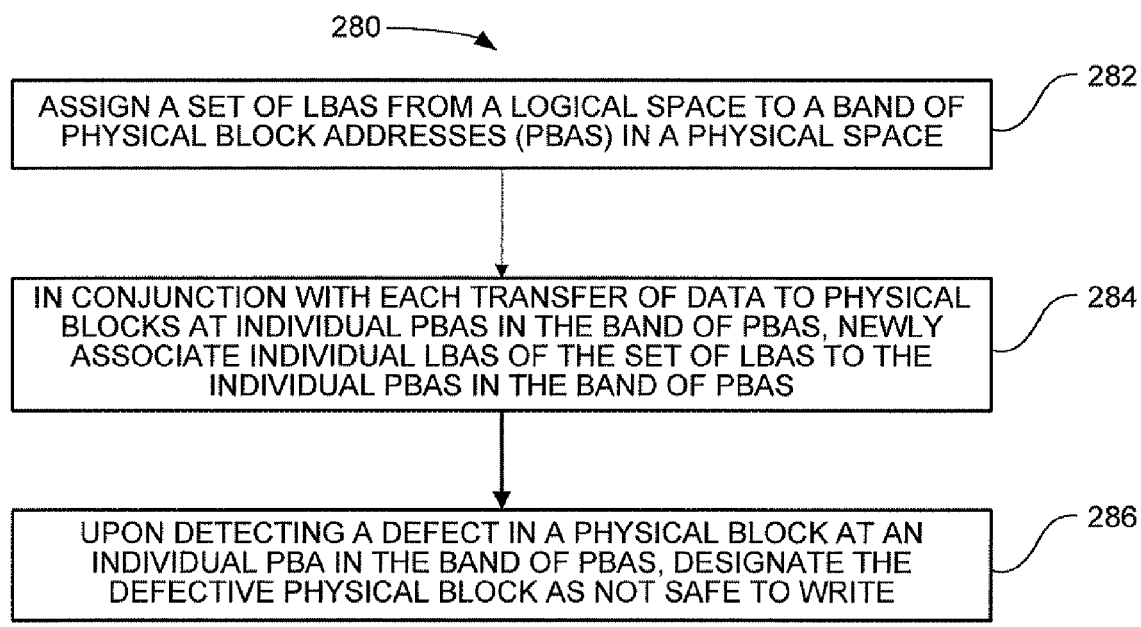

Referring now to FIGS. 18A and 18B, flow diagrams 270 and 280 are provided to briefly illustrate a general defect-management process embodiment and a more specific defect-management process embodiment. The general embodiment shown in FIG. 18A is independent of the presence or absence of a pre-established substantially one-to-one correspondence between LBAs in the logical space and physical blocks (for example, sectors) in the physical space. Further, since this embodiment does not use reserved spare sectors to carry out defect management, it is independent of the presence or absence of any spare sectors. A first step (272) in the process of FIG. 18A involves, upon detecting a defect in a first physical block on a storage medium, mapping out the first physical block from a logical-to-physical mapping of the storage medium. The logical-to-physical mapping of the storage medium is independent of any pre-established spare sectors. At step 274, data is stored to the storage medium according to the logical-to-physical mapping of the storage medium. In the more specific embodiment of FIG. 18B, there is no pre-established substantially one-to-one correspondence between LBAs in the logical space and physical blocks in the physical space. A first step (282) in the process of FIG. 18B involves assigning a set of LBAs from a logical space to a band of physical block addresses (PBAs) in a physical space. At step 284, in conjunction with each transfer of data to physical blocks at individual PBAs in the band of PBAs, individual LBAs of the set of LBAs are newly associated to the individual PBAs in the band of PBAs. At step 286, upon detecting a defect in a physical block at an individual PBA in the band of PBAs, the defective physical block is designated as not safe to write.

The above-described embodiments allow data storage devices to maintain best possible performance while also maintaining data integrity by mapping out all known defective blocks. It should be noted that, although some of the above-described embodiments implement full allocation and deallocation for each write, the principles of the disclosure are also applicable where full allocation and deallocation for each write is not carried out. Such embodiments are very briefly discussed below.

As described earlier, in some block storage device embodiments, blocks are re-written as a part of data integrity maintenance. One case in which re-writing is required is recording methods that utilize overlapped tracks for density increases while not implementing full deallocation and new allocation for each write. In this embodiment, the re-write process includes re-mapping to replace the alternating of defects with skipping. This is applied when the re-write is extended to the end of a band at which unallocated, spare blocks are available. Such bands and their extra blocks are typical of systems with overlapped tracks.

Figure 19:
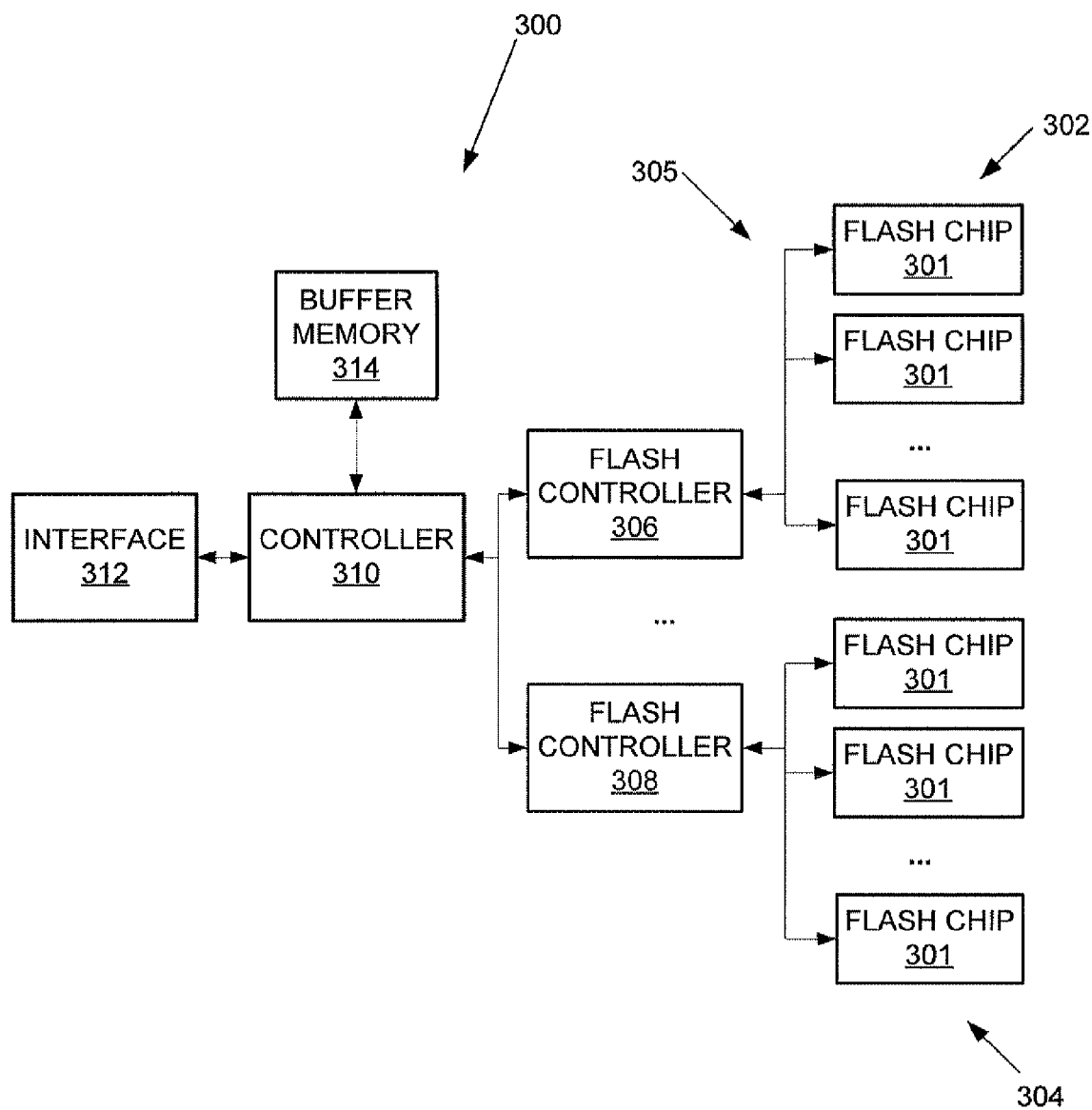
FIG. 19 is a simplified block diagram of a solid state data storage device in which the present embodiments are useful.

FIG. 19 is a simplified block diagram of a solid state data storage device 300 in which the present embodiments are useful. In contrast with data storage device 100 (of FIG. 1), which employs data storage media that rotate, device 300 has no moving parts. As can be seen in FIG. 19, device 300 includes multiple groups of flash memory chips (such as 302 and 304), with each group including a separate flash memory controller 306, 308. In FIG. 19, the flash memory is collectively denoted by reference numeral 305. Storage device 300 also includes a device controller 310 that communicates with individual flash memory controllers (such as 306 and 308). Device controller 310 receives read/write requests via interface 312 and satisfies the requests with the help of the flash memory controllers (such as 306 and 308) and buffer memory 314.

In FIG. 19, individual flash memory chips are denoted by reference numeral 301. As in the case of sectors of data storage media 110 (of FIG. 1), individual storage locations within flash memory chips 301 are also subject to defects. It should be noted that the term factory-time defect also applies to a chip factory-time defect when individual chips (such as 301) are manufactured. In any case, as noted earlier, the present embodiments address both factory-time and grown defects (defects not present at the time of manufacture) in a substantially similar manner. Note that, as in the case of the earlier described embodiments, device 300 also includes a dynamically updated map (not shown in FIG. 19) that mutably associates logical blocks to physical blocks. The dynamically updated map also includes physical block defect allocations. Details regarding the configuration of flash memory 305 are provided below.

Figure 20:
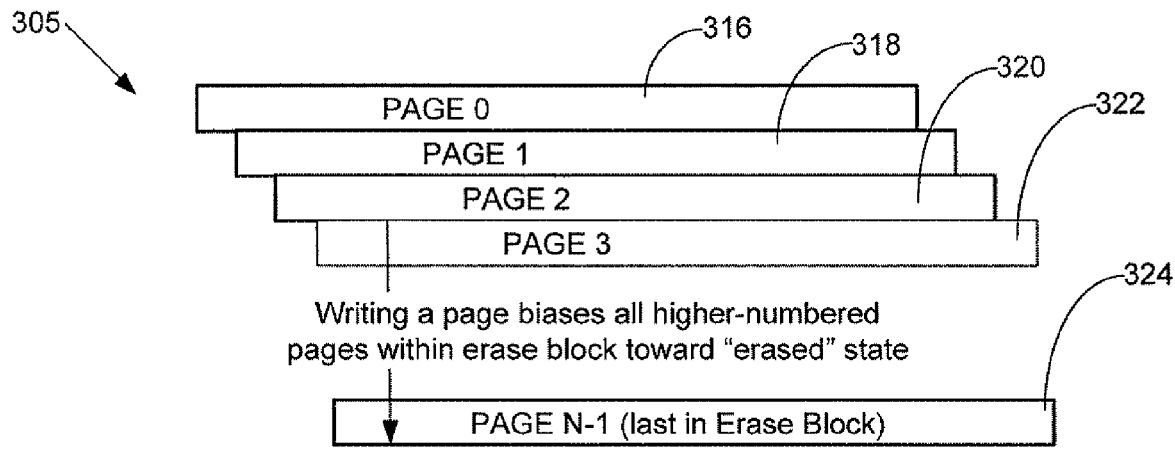
FIG. 20 illustrates a data write technique that can be employed by the device of FIG. 19 in conjunction with the present embodiments.
Figure 21:
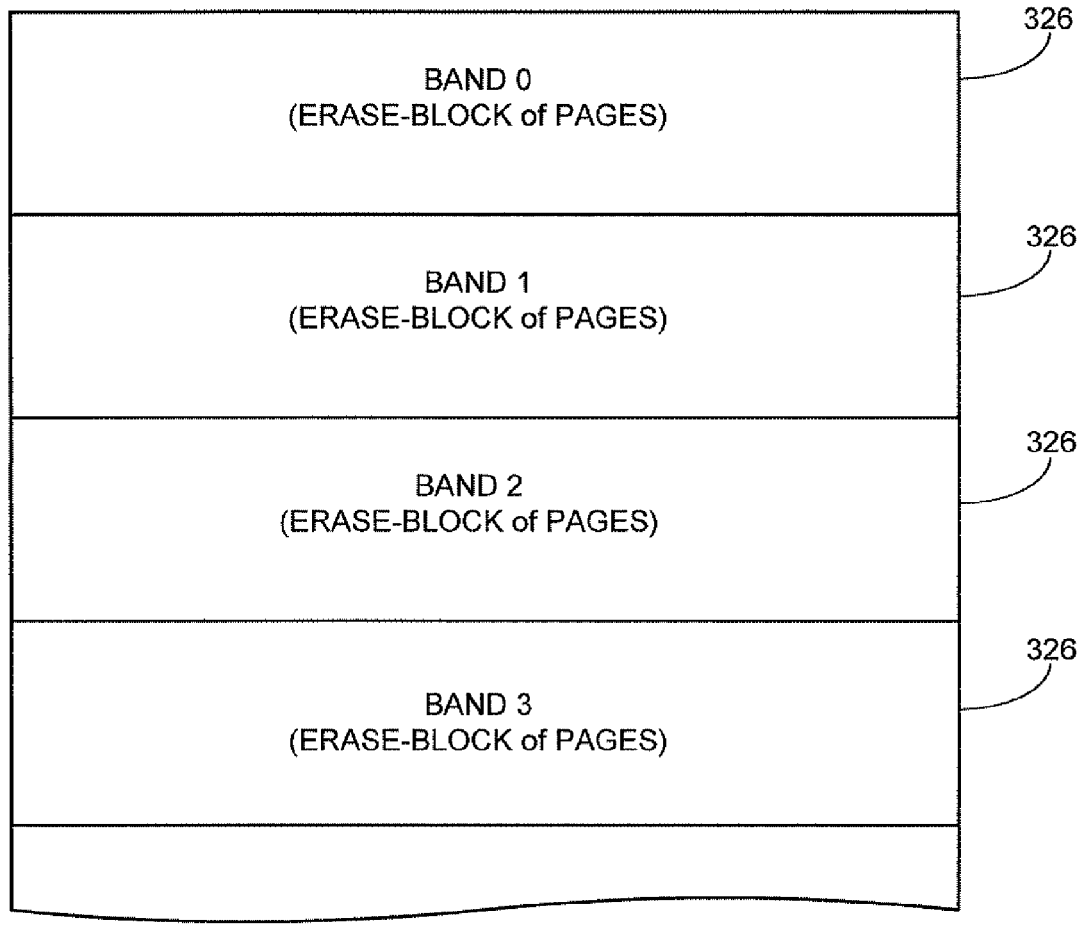
FIG. 21 provides a generalized structure for a portion of the physical space of the flash memory of FIG. 19.

In general, flash memory 305 is configured to include multiple erase-blocks, with each erase-block including multiple pages. Each page, in turn, includes multiple memory locations (sectors). FIG. 20 illustrates flash memory pages 0 through N-1 (denoted by reference numerals 316 through 324), which, in the present embodiments, are organized in a similar manner to tracks (such as 140, 144, 148, 152 and 154) shown in FIG. 3. As can be seen in FIG. 21, which is similar to FIG. 4, each erase-block corresponds to a band 326. Thus, as in the case of the earlier-described disc drive embodiments, flash memory 305 is divided into multiple bands, with each band including multiple pages. Each page includes a plurality of sectors (not shown in the interest of simplification), with each of the plurality of sectors having a corresponding PBA. Also, in accordance with the present embodiments, LBAs are mutably associated with the PBAs in each band. It should be noted that the flash memory embodiments (such as the embodiment shown in FIG. 21) do not include guard regions such as 164 shown in FIG. 4. It should also be noted that writing a page in flash memory biases all higher-numbered pages within an erase-block toward an "erased" state.

Figure 22:
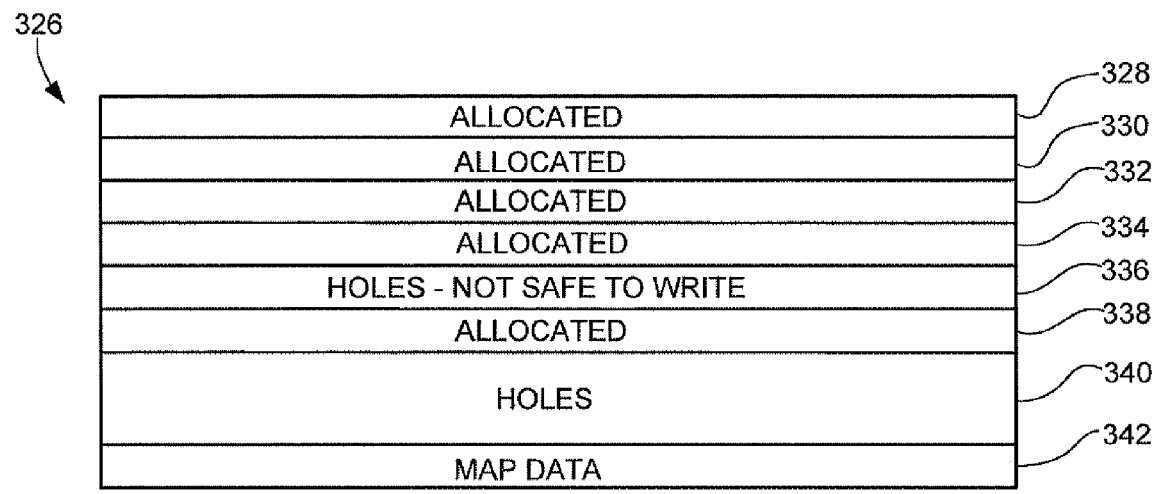
FIGS. 22 and 23 illustrate a selected one of the bands from FIG. 21 under different operational conditions.
Figure 23:
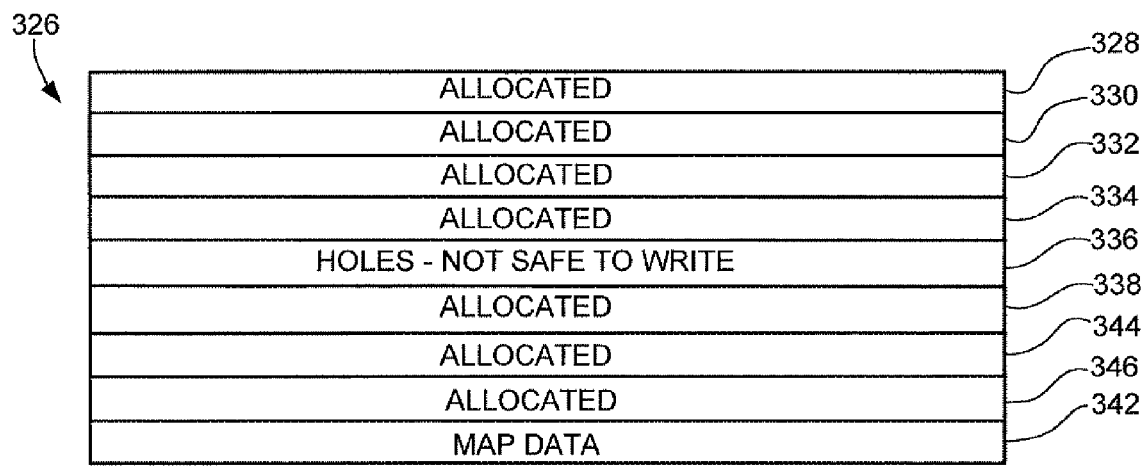

In a flash memory (such as 305), a subset (less than all) sectors within an erase-block can be written during a particular write operation. The remaining sectors in the erase-block can be written during one or more subsequent write operations. FIGS. 22 and 23, which are similar to FIGS. 6 and 7, show an exemplary band (which corresponds with an erase block) 326 after multiple write operations have taken place.

In FIG. 22, it can be seen that user data have been written to various sectors as indicated by the "allocated" legend in pages 328, 330, 332, 334, and 338. This may have constituted a single relatively long write operation, or multiple consecutive and abutting writes. Additional data have been written to the sectors on page 338.

Note that page 336 does not store user data, but is rather described by the legend, "holes—not safe to write." This is a result of the allocation of the downstream sectors of page 338; since user data now exist on page 338, attempts to write data to the upstream track 336 would likely result in the loss of the data on the downstream page in an embodiment where the flash memory pages are characterized as pages that physically have inter-symbol interference.

Map data 342 serves to allow dynamic allocation of sectors based on the available space. As each set of LBAs are assigned for writing to the band 326, a table is maintained and updated to show which physical sectors are now allocated to store such LBAs (preferably by way of the aforementioned PBAs). As the data are written, the map is also updated to identify other considerations such as the upstream holes (e.g., page 336) to which data cannot be safely written, as well as remaining available holes (block 340) and the locations thereof within the band.

FIG. 23 shows a snapshot of the band 326 at a later time after additional actions have taken place with regard to the band. Specifically, holes 340 are now allocated. The newly allocated pages and denoted by reference numerals 342 and 344. Of course, map data 342 is updated to reflect the changes in allocation status. It should be noted that FIGS. 21 through 23 show an exemplary embodiment in which there is one-to-one correspondence between an erase-block and a band, such one-to-one correspondence is not required and therefore other configurations are possible.

The above-described FIGS. 22 and 23 relate to mutable logical to physical block allocation within a band. However, in a manner similar to that shown in FIG. 12, an assignment of a set of LBAs to a particular band in the above-described flash memory embodiment can also be changed.

It is to be understood that even though numerous characteristics and advantages of various embodiments have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular control environment without departing from the spirit and scope of the present disclosure.

In addition, although a majority of the embodiments are directed to a multiple disc array that employs a number of hard disc drives to present a common addressable memory space, it will be appreciated by those skilled in the art that the claimed subject matter is not so limited and various other data storage systems, including optical based and solid state data storage devices (which are briefly described), can readily be utilized without departing from the spirit and scope of the claimed embodiments.

Note that, in a flash memory, a physical block that is not safe to write is also not safe to erase and therefore a general term of "not safe to use" has been included in the claims in connection with a defective physical block to not limit the claims to a particular type of data storage device.

What is claimed is:

1. A method comprising:
   assigning a set of logical block addresses (LBAs) from a logical space to physical block addresses (PBAs) in a physical space, the physical space having physical blocks which are each associated with a different one of the PBAs;
   upon detecting a defect in a physical block at a particular PBA of the PBAs in the physical space, designating the defective physical block as not safe to use;
   in conjunction with a transfer of data to the physical blocks at individual PBAs in the physical space, recognizing the defective physical block as not safe to use and newly associating individual LBAs of the set of LBAs to the individual PBAs in the physical space other than the PBA associated with the defective physical block,
   wherein assigning the set of LBAs from the logical space to PBAs in the physical space comprises assigning the set of LBAs from the logical space to a band of PBAs in the physical space, and
   wherein designating the defective physical block as not safe to use comprises updating map data to indicate that the individual PBA of the defective physical block is permanently unavailable for association with any individual LBA of the set of LBAs currently assigned to the band.

2. The method of claim 1 wherein the map data identifies, for each of the PBAs, whether the PBA is currently available for association with a LBA from the set of LBAs.

3. The method of claim 2 wherein the physical space comprises a storage medium, and wherein the map data is stored on the storage medium.

4. The method of claim 3 wherein certification of at least some of the physical blocks on the storage medium is carried out subsequent to installation of the storage medium in a storage device and subsequent to completion of manufacture of the storage device.

5. The method of claim 1 wherein the defect in the physical block is a grown defect.

6. The method of claim 1 wherein the defect in the physical block is a factory-time defect.

7. The method of claim 1 wherein the physical space comprises a storage medium, and wherein the band comprises a plurality of tracks on the storage medium.

8. The method of claim 7 wherein the plurality of tracks are characterized as overlapping tracks.

9. The method of claim 1 wherein the physical space comprises a storage medium, and wherein the band comprises flash memory pages on the storage medium.

10. The method of claim 9 wherein the flash memory pages are characterized as pages that physically have inter-symbol interference.

11. The method of claim 1 wherein the assigning the set of LBAs from the logical space to the PBAs in the physical space, and the newly associating individual LBAs of the set of LBAs to the individual PBAs in the physical space in conjunction with the transfer of data to the physical blocks at individual PBAs in the physical space, are carried out independently of any reserved spare sectors.

* * * * *